United States Patent
Takahashi et al.

(10) Patent No.: US 11,014,167 B2
(45) Date of Patent: May 25, 2021

(54) MULTILAYER HARD FILM-COATED CUTTING TOOL

(71) Applicants: MITSUBISHI MATERIALS CORPORATION, Tokyo (JP); Oerlikon Surface Solutions AG, Pfäffikon, Pfäffikon (CH)

(72) Inventors: Masakuni Takahashi, Ogaki (JP); Denis Kurapov, Walenstadt (CH); Volker Derflinger, Feldkirch (AT); Wolfgang Kalss, Feldkirch (AT)

(73) Assignees: MITSUBISHI MATERIALS CORPORATION, Tokyo (JP); Oerlikon Surface Solutions AG, Pfäffikon, Pfäffikon (CH)

( * ) Notice: Subject to any disclaimer, the term of this patent is extended or adjusted under 35 U.S.C. 154(b) by 115 days.

(21) Appl. No.: 16/322,258

(22) PCT Filed: Jul. 28, 2017

(86) PCT No.: PCT/JP2017/028330
§ 371 (c)(1),
(2) Date: Jan. 31, 2019

(87) PCT Pub. No.: WO2018/025977
PCT Pub. Date: Feb. 8, 2018

(65) Prior Publication Data
US 2019/0193165 A1 Jun. 27, 2019

(30) Foreign Application Priority Data
Aug. 1, 2016 (JP) .............................. JP2016-151307

(51) Int. Cl.
*B23B 27/14* (2006.01)
*C23C 14/06* (2006.01)
*C23C 14/32* (2006.01)
*C23C 28/04* (2006.01)
*C23C 14/50* (2006.01)
(Continued)

(52) U.S. Cl.
CPC ........ *B23B 27/148* (2013.01); *C23C 14/0641* (2013.01); *C23C 14/325* (2013.01);
(Continued)

(58) Field of Classification Search
CPC ................ B23B 27/14; B23B 2228/10; B23B 2228/105; B23B 2228/36; C23C 14/0641; C23C 28/044
(Continued)

(56) References Cited

U.S. PATENT DOCUMENTS

| 8,673,435 B2* | 3/2014 | Kudo ................... C23C 28/322 428/216 |
| 2002/0039670 A1* | 4/2002 | Ishikawa ................. C23C 14/06 428/699 |

(Continued)

FOREIGN PATENT DOCUMENTS

| CN | 105296949 A | 2/2016 |
| EP | 2591869 A1 | 5/2013 |

(Continued)

OTHER PUBLICATIONS

International Search Report and Written Opinion dated Oct. 17, 2017 for the corresponding PCT International Patent Application No. PCT/JP2017/028330.
(Continued)

*Primary Examiner* — Archene A Turner
(74) *Attorney, Agent, or Firm* — Leason Ellis LLP

(57) ABSTRACT

A multilayer hard film-coated cutting tool including a cutting tool body and a multilayer hard film formed on a surface of the cutting tool body, wherein the multilayer hard film comprises at least an upper layer and a lower layer; the upper layer is made of a Ti and Si compound layer; the lower layer is made of a multi-layered film of an A-layer and a B-layer, a layer thickness of the B-layer is equal to or thicker than a
(Continued)

layer thickness of the A-layer, a ratio of the layer thicknesses of the A-layer and the B-layer being A-layer:B-layer=1:1 to 1:2, the multilayer hard films having 2 to 8 pairs of the A-layer and the B-layer in a case where a single pair is defined by a combination of a single A-layer and a single B-layer.

9 Claims, 9 Drawing Sheets

(51) Int. Cl.
 *C23C 28/00* (2006.01)
 *B23B 51/00* (2006.01)
(52) U.S. Cl.
 CPC ............ *C23C 14/505* (2013.01); *C23C 28/04* (2013.01); *C23C 28/042* (2013.01); *C23C 28/044* (2013.01); *C23C 28/42* (2013.01); *B23B 51/00* (2013.01); *B23B 2222/28* (2013.01); *B23B 2224/00* (2013.01); *B23B 2228/10* (2013.01); *B23B 2228/105* (2013.01); *B23B 2228/24* (2013.01); *B23B 2228/36* (2013.01)
(58) Field of Classification Search
 USPC .......... 51/307, 309; 428/216, 336, 697, 698, 428/699, 704
 See application file for complete search history.

(56) References Cited

U.S. PATENT DOCUMENTS

| | | |
|---|---|---|
| 2006/0222893 A1 | 10/2006 | Derflinger |
| 2008/0166588 A1* | 7/2008 | Astrand ................ C23C 30/005 428/698 |
| 2008/0171183 A1* | 7/2008 | Yamamoto .............. C23C 28/42 428/215 |
| 2012/0090247 A1* | 4/2012 | Miura ..................... C04B 41/52 51/309 |

FOREIGN PATENT DOCUMENTS

| | | |
|---|---|---|
| JP | 3705381 B | 10/2005 |
| JP | 2008-049455 A | 3/2008 |
| JP | 2008-188689 A | 8/2008 |
| JP | 2011-235393 A | 11/2011 |
| JP | 5289042 B | 9/2013 |
| JP | 2014-069258 A | 4/2014 |
| JP | 2014-087858 A | 5/2014 |

OTHER PUBLICATIONS

European Search Report dated Nov. 25, 2019 for the corresponding European Patent Application No. 17837078.9.

* cited by examiner

Cutting length: cutting length until the life (m)
Tool life ratio 1 : the ratio of tool life relative to the tool life of the conventional drill 1.

MULTILAYER HARD FILM-COATED CUTTING TOOL

CROSS-REFERENCE TO RELATED PATENT APPLICATIONS

This application is a U.S. National Phase Application under 35 U.S.C. § 371 of International Patent Application No. PCT/JP2017/028330, filed Jul. 28, 2017, and claims the benefit of Japanese Patent Application No. 2016-151307, filed on Aug. 1, 2016, all of which are incorporated herein by reference in their entirety. The International Application was published in Japanese on Feb. 8, 2018 as International Publication No. WO/2018/025977 under PCT Article 21(2).

FIELD OF THE INVENTION

The present invention relates to a multilayer hard film-coated cutting tool used for cutting of metallic materials or the like (hereinafter, referred as "the coated tool"), and particularly, relates to a multilayer hard film-coated cutting tool that shows a long tool life in either the standard cutting (at low speed) or the high-speed cutting of carbon steel, alloy steel, or the like.

BACKGROUND OF THE INVENTION

Conventionally, the coated tools include; inserts which are used for turning and planing of works made of varieties of steel, casted iron, and the like by being attached to the tip of insert holders detachably; drills and miniature drill which are used for drilling cutting and the like of works; and solid-type end mills which are used for facing, grooving, shouldering, and the like of works. In addition, insert-type end mills, which are used for cutting similarly to the solid-type end mills and attached as inserts detachably, are known.

Recently, demand for improvement of efficiency in cutting of metallic materials is increased; and cutting at a higher cutting speed is required. Because of this, improving the wear resistance and the fracturing resistance of the coatings that coat the surfaces of the cutting tool body of the cutting tools is needed.

For example, coated tools such as drills and the like are proposed in Japanese Unexamined Publication No. 2014-69258). The coated tools proposed in Japanese Unexamined Publication No. 2014-69258 are coated by the first and the third hard coating films, both of which are made of TiAl-CrSiN; and the second coating film made of TiSiN. The coated tools are coated by these three coating films in the order of the first coating film, the second coating film, and the third coating film from the base material side of the coated tools. In addition, the film thickness of the first coating film is thicker than thicknesses of the second and the third coating films. By having the hard coating film with the above-described coating structure, the film stress of each hard coating film constituting the multilayer hard film is reduced. It is understood that even a cutting tool with a small diameter such as drills can be coated with the multilayered film; and such a tool shows an excellent wear resistance.

In Japanese Patent No. 3705381, coated tools are proposed. The coated tools proposed in Japanese Patent No. 3705381 are coated with 2 or more layers of A-layer made of Ti nitride or Ti carbonitride; or A-layer made of TiAl nitride or TiAl carbonitride. In addition, the value of I(200) I(111) of the layer made of Ti nitride or Ti carbonitride is 1 or more and the value of I(200)I(111) of the layer made of TiAl nitride or TiAl carbonitride is 1 or more, in the case where I(111) is defined as diffraction intensity of (111) plane and I(200) is defined as diffraction intensity of (200) plane in X-ray diffraction. In addition, an intermediate layer, which is made of both of a Ti nitride/carbonitride layer and a TiAl nitride/carbonitride layer and has the thickness of 5 nm to 500 nm, is interposed between each layer of the multilayer coatings. It is understood that by having the above-described layer structure, the residual compressive stress in the layers is reduced, and forming a thick layer becomes possible. As a result, the wear resistance is improved.

In Japanese Unexamined Publication No. 2014-87858, coated drills are proposed. In the coated drills proposed in Japanese Unexamined Publication No. 2014-87858, 4 or more layers of the first complex nitride layer and the second complex nitride layer are formed alternatingly as a hard coating layer on the surface of the cutting tool bodies made of tungsten carbide-based cemented carbide. The first complex nitride layer is directly deposited on the surface of the cutting tool body at least and has the average layer thickness of 0.5 μm to 1.25 μm. The first complex nitride layer is a Al and Ti complex nitride layer having the average composition satisfying 0.3≤X≤0.7 (X value is in atomic ratio) in the case where it is expressed by the composition formula $(Al_{1-X}Ti_X)$N. The second complex nitride layer has the average layer thickness of 0.5 μm to 1.25 μm; and is a Al and Cr complex nitride layer having the average composition satisfying 0.2≤X≤0.6 (X value is in atomic ratio) in the case where it is expressed by the composition formula $(Al_{1-a}Cr_a)$N. According to the coated tools (drills), it is understood that wear and peeling of the hard coating layer can be suppressed, and the tool life of the tools can be extended.

In Japanese Patent No. 5289042, coated tools with multilayered-hard coating layers having improved wear resistance are proposed. As a cutting tool, the coated tool proposed in Japanese Patent No. 5289042 include at least any one layer selected from the group of at least one $(Al_y Cr_{1-y})$X layer (satisfying 0.2≤y≤0.7; and X being an element among N, C, B, CN, BN, CBN, NO, CO, BO, CNO, BNO, CBNO) and at least one $(Ti_z Si_{1-z})$X layer (satisfying 0.99≥z≥0.7) as a hard material layer.

The hard material layer includes at least A-layer package having a constitution of one (AlCrTiSi)X mixed layer; one $(Ti_z Si_{1-z})$N layer or $(Al_y Cr_{1-y})$N layer after the above-mentioned (AlCrTiSi)X mixed layer; another (AlCrTiSi)X mixed layer after the above-mentioned $(Ti_z Si_{1-z})$N layer or $(Al_y Cr_{1-y})$N layer; and another $(Al_y Cr_{1-y})$N layer after the above-mentioned another (AlCrTiSi)X mixed layer.

In the layer package, the layer thickness of the $(Al_y Cr_{1-y})$N layer or one of $(Al_y Cr_{1-y})$N layers is 75 nm to 200 nm or the layer thickness of the $(Ti_z Si_{1-z})$N layer is 50 to 150 nm; and the (AlCrTiSi)X mixed layer has the layer thickness of 20±10 nm.

In addition, it is described that: at least the at least the one $(Al_y Cr_{1-y})$N layer, the one or more of $(Al_y Cr_{1-y})$N layer of the layer package, and the (AlCrTiSi)X mixed layer may further include at least one of W, V, Mo, Nb and. Si; the hard material layer includes 4 to 11 of the layer packages (refer the claim 5); and one $(Al_y Cr_{1-y})$X surface layer or one $(Ti_z Si_{1-z})$X surface layer is formed on the outermost surface of the hard material layer, in Japanese Patent No. 5289042.

Technical Problem

Recent cutting equipment is automatized remarkably. On the other hand, demands for power-saving, energy-saving, and cost reduction in cutting work are strong. Furthermore, cutting tools, which can be used in any cutting conditions of the normal (low-speed) cutting and the high-speed cutting and have broad utility, are needed.

For example, the cutting tool proposed in Japanese Patent No. 3705381 shows excellent tool life without fracturing or the like in the cutting work in high-speed range. However, it has a problem that the cutting tool reaches to the tool life in a short time due to chipping in the cutting work in the normal (low-speed) range.

The cutting tool proposed in Japanese Unexamined Publication No. 2014-87858 shows excellent tool life with a few chipping in the cutting work in the normal (low-speed) range. However, it has a problem that the cutting tool reaches to the tool life in a short time due to fracturing in the cutting work in the high-speed range.

In addition, in the cutting tools proposed in Japanese Unexamined Patent Publication No. 2014-69258, Japanese Patent No. 3705381, Japanese Unexamined Publication No. 2014-87858 and Japanese Patent No. 5289042, the internal stress within the layer increases significantly in the case where extension of the tool life is intended by thickening of the outermost layer of the multilayered coating film; and cutting edges are likely to be fractured by load in cutting work. Thus, they have the problem not only that the life-extending effect corresponding to their layer thicknesses cannot be obtained but also that the processing quality is reduced.

As explained above, the coated tool having broad utility exhibiting excellent wear resistance without anomalous damage such as chipping, fracturing, or the like in any cutting condition of the normal (low-speed) cutting condition and the high-speed cutting condition. In addition, the coated tool, the tool life of which can be extended by thickening the hard film, is needed.

SUMMARY OF THE INVENTION

Solution to Problem

Under the viewpoints described above, the inventors of the present invention conducted intensive studies to develop the long-tool life coated tools that show performance with broad utility in the normal (low-speed) cutting condition and in the high-speed cutting condition and exhibit excellent wear resistance for a long time without anomalous damages such as chipping, fracturing, or the like.

Particularly, the inventors of the present invention obtained following findings in the studies about the layer structure of the coated tools.

The number of dissimilar interface, existing of which leads to significant increase of stress is reduced and the volume ratio of the B-layer, which is explained below, is increased in order to relax stress by:

(1) constituting the upper layer of the multilayer hard film by $(Ti_zSi_{1-z})X$ and optimizing the layer thickness of the upper layer in a coated film coated by a multilayer hard film on a cutting tool body made of WC-based cemented carbide or the like;

(2) forming the lower layer made of a multilayer hard film between the upper layer and the cutting tool body as an alternatingly stacked structure of $(Al_yCr_{1-y})X$ layers (hereinafter, referred to as "A-layers"); and mixed layers of $(Ti_zSi_{1-z})X$ and $(Al_yCr_{1-y})X$ (hereinafter, the mixed layers are also referred to as (TiAlCrSi)X mixed layers or also referred to as "B-layers"); and (3) optimizing the layer thicknesses of the A-layers and B-layers and constituting the lower layer by repeating pairs of one A-layer and one B-layer, preferably in the range of 2 to 8 pairs.

The coated tool of the present invention, which is coated by the multilayer hard film that satisfies the above-defined conditions (1) to (3), exhibits excellent wear resistance without anomalous damages such as chipping, fracturing, or the like in both of the normal (low-speed) cutting condition and the high-speed cutting condition. Furthermore, it is unlikely for the anomalous damages such as chipping, fracturing, or the like to occur even if the upper layer is thickened. As a result, the coated tool exhibits excellent cutting performance for a long time usage.

In addition to the above-described (1) to (3), the inventors of the present invention found that:

(4) in the case where a periodical composition fluctuation of an element among the component elements excluding the element X is formed in a predetermined cycle width and a predetermined composition fluctuation ratio in the layer, not only the stress relaxation effect by the B-layer, but also the wear resistance improving effect is obtained. Thus, the chipping resistance, the fracturing resistance, and the wear resistance are improved even more, and the tool life of the coated tool is extended.

The present invention is made based on the findings above, and has the aspects described below.

(1) A multilayer hard film-coated cutting tool including a cutting tool body and a multilayer hard film formed on a surface of the cutting tool body, wherein (a) the multilayer hard film comprises at least an upper layer and a lower layer;

(b) the upper layer comprises at least a Ti and Si compound layer, which includes X and has preferably a layer thickness of 0.075 μm to 1.5 μm, $0.7 \leq z \leq 0.99$ (z in atomic ratio) being satisfied in a case where the Ti and Si compound is expressed by a composition formula of $(Ti_zSi_{1-z})X$ and X being any one of N, C, B, CN, BN, CBN, NO, CO, BO, CNO, BNO, and CBNO;

(c) the lower layer is made of a multi-layered film of pairs of one A-layer and one B-layer, a layer thickness of the B-layer is equal to or thicker than a layer thickness of the A-layer, a ratio of the layer thicknesses of the A-layer and the B-layer being preferably A-layer:B-layer=1:1 to 1:2, the multilayer hard films having preferably 2 to 8 pairs of the A-layer and the B-layer in a case where a single pair is defined by a combination of a single A-layer and a single B-layer;

(d) the A-layer is a layer made of a compound including at least Al and Cr, $0.2 \leq y \leq 0.7$ (y in atomic ratio) being satisfied in a case where the compound including at least Al and Cr is expressed by a composition formula of $(Al_yCr_{1-y})X$ and X being any one of N, C, B, CN, BN, CBN, NO, CO, BO, CNO, BNO, and CBNO; and (e) the B-layer is a mixed layer of the $(Ti_zSi_{1-z})X$ and the $(Al_yCr_{1-y})X$, X being any one of N, C, B, CN, BN, CBN, NO, CO, BO, CNO, BNO, and CBNO.

(2) The multilayer hard film-coated cutting tool according to the above-described (1), wherein the upper layer containing at least Ti and Si has preferably a layer thickness of 0.2 μm to 1.5 μm.

(3) The multilayer hard film-coated cutting tool according to the above-described (1), wherein the upper layer containing at least Ti and Si has preferably a layer thickness of 0.6 μm to 1.5 μm.

(4) The multilayer hard film-coated cutting tool according to the above-described (1), wherein each single A-layer comprised in the lower layer has preferably a layer thickness of 0.25 μm to 1.5 μm.

(5) The multilayer hard film-coated cutting tool according to the above-described (1), wherein each B-layer comprised in the lower layer has a layer thickness of 0.25 μm to 2.5 μm.

(6) The multilayer hard film-coated cutting tool according to any one of the above-described (1) to (5), wherein at least one layer of the A-layers and at least one layer of the B-layers further include at least one component element selected from W, V, Mo, Nb, Ta, Hf, and Zr; or Si.

(7) The multilayer hard film-coated cutting tool according to any one of the above-described (1) to (6), wherein the B-layer has a periodical composition fluctuation of at least one component among the component elements excluding the element X;

a width of the periodical composition fluctuation is 20 nm to 200 nm, the width of the periodical composition fluctuation (nm) being obtained as a thickness between a location having a local maximum content of the component and adjacent location having a local maximum content of the component; and a composition variation rate of the periodical composition fluctuation is 5% to 95%, the composition variation rate being obtained as a ratio (%) in which a difference of the local maximum content and a local minimum content is divided by the local maximum content.

(8) The multilayer hard film-coated cutting tool according to a any one of the above-described (1) to (7), wherein a bottom layer is formed between the cutting tool body and the lower layer; and the bottom layer is made of the A-layer having a layer thickness of 0.05 μm to 1.5 μm and the B-layer having a layer thickness of 0.05 μm to 2.5 μm.

(9) The multilayer hard film-coated cutting tool according to any one of the above-described (1) to (8), wherein a bottom layer is formed between the cutting tool body and the lower layer; and the bottom layer is made of the A-layer having a layer thickness of 0.05 μm to 1.5 μm and the B-layer having a layer thickness of 0.05 μm to 2.5 μm.

The coated tool of the present invention is explained below in reference to drawings.

The schematic view of the cross section of the multilayer hard film of the coated tool of the present invention having a multilayer hard film is shown in FIG. 1.

In the present invention, the multilayer hard film is formed on the surface of the cutting tool body made of WC-based cemented carbide by physical vapor deposition using an arc ion plating (AIP) apparatus shown in FIG. 3, for example.

As the upper layer, the layer of compound containing at least Ti and Si, which is expressed by the composition formula $(Ti_zSi_{1-z})X$, is formed as shown by $(Ti_zSi_{1-z})X$ in FIG. 1.

In the formula, $0.7 \leq z \leq 0.99$ (z is in atomic ratio) is satisfied; and X is any one selected from N, C, B, CN, BN, CBN, NO, CO, BO, CNO, BNO, and CBNO.

The upper layer made of the above-described layer of a composition including at least Ti and Si has improved oxidation resistance because of including Si component. Thus, excellent high hardness is maintained even under a high temperature condition in cutting. However, if the z value, which represents the content amount of Ti in the total amount of Ti and Si, were less than 0.7, the high temperature toughness and the high temperature strength of the upper layer would be reduced. On the other hand, if the z value exceeded 0.99, the hardness improving effect due to including the Si component would not be obtained.

Therefore, the z value is set to the range of $0.7 \leq z \leq 0.99$ (z is in atomic ratio). Preferably, it is set to the range of $0.85 \leq z \leq 0.95$ (z is in atomic ratio)

According to a preferred embodiment of the present invention, which is particularly suitable for some cutting applications, the upper layer is made essentially of $(Ti_zSi_{1-z})X$.

The upper layer shows excellent wear resistance. Regarding to the element X in the composition formula $(Ti_zSi_{1-z})X$, by selecting any one of N, C, B, CN, BN, CBN, NO, CO, BO, CNO, BNO, and CBNO, the upper layer shows hard and similar characteristics.

Therefore, as the element X, any one selected from N, C, B, CN, BN, CBN, NO, CO, BO, CNO, BNO, and CBNO, may be used. In order to obtain more excellent hardness and wear resistance, selecting N or CN as the element X is preferable.

The action of the element X in the A and B-layers described later is the same as the case of the upper layer.

If the layer thickness of the upper layer were less than 0.075 μm, it would not exhibit excellent wear resistance for a long time usage and the tool life of the tool would be short. On the other hand, if the layer thickness of the upper layer exceeded 1.5 μm, it would be likely that anomalous damages such as chipping, fracturing, being self-destructed, or the like occur due to the internal stress in layers.

Therefore, the layer thickness of the upper layer is set to 0.075 μm to 1.5 μm. Preferably, it is set to 0.2 μm to 1.5 μm, and more preferably it is set to 0.6 μm to 1.5 μm.

In the present invention, the lower layer is formed between the upper layer and the tool body as shown in FIG. 1. According to a preferred embodiment of the present invention, which is particularly suitable for some cutting applications, the upper layer is directly deposited on the lower layer.

The lower layer is made of a multi-layered film of an A-layer and a B-layer, a layer thickness of the B-layer is equal to or thicker than a layer thickness of the A-layer, a ratio of the layer thicknesses of the A-layer and the B-layer being A-layer:B-layer=1:1 to 1:2; and made of the multi-layer hard film having the repeated pairs in the range of 2 to 8 pairs, the pair being defined as A-layer having one pair, in which one A-layer and one B-layer are combined. Preferably, the layer thickness of the single A-layer is 0.25 μm to 1.5 μm; and the layer thickness of the single B-layer is 0.25 μm to 2.5 μm.

The A-layer is layer of a compound containing at least Al and Cr represented by the composition formula of $(Al_yCr_{1-y})X$.

According to a preferred embodiment of the present invention, which is particularly suitable for some cutting applications, the A layers are made essentially of $(Al_yCr_{1-y})X$.

The B-layer is a mixed layer (shown as "(TiAlCrSi)X" in FIG. 1) of compound layers containing at least Al and Cr represented by the composition formula of $(Al_yCr_{1-y})X$ (the same composition formula as the above-mentioned A-layer); and compound layers containing at least Ti and Si represented by the composition formula of $(Ti_zSi_{1-z})X$ (the same composition formula as the above-mentioned upper layer).

According to a preferred embodiment of the invention, the mixed layer is formed of $(Ti_zSi_{1-z})X$ layers and $(Al_yCr_{1-y})X$ layers, wherein each individual $(Ti_zSi_{1-z})X$ layer and each individual $(Al_yCr_{1-y})X$ layer is deposited alternate one on each other, and wherein each individual $(Ti_zSi_{1-z})X$ layer and each individual $(Al_yCr_{1-y})X$ layer comprised in the mixed layer has preferably an individual layer thickness in nanometers size, it means preferably not thicker than 100 nm. However, since according to the present invention the mixed layer can be deposited by using a co-deposition method, it is possible that between one $(Al_yCr_{1-y})X$ layer and one $(Ti_zSi_{1-z})X$ layer deposited one on each other, a mixed nanolayer comprising Al, Cr, Ti and X can be formed.

The Al component, which is a constituent of the A-layer, has an action to improve the high temperature hardness. The Cr component, which is a constituent of the A-layer, has action to improve the high temperature toughness and high temperature strength. In addition, by having Al and Cr in a co-existed state, the oxidation resistance is improved. If the value y (in atomic ratio), which shows the content ratio of Al relative to the total amount of Al and Cr, is less than 0.2, the high temperature hardness of the A-layer would become insufficient. On the other hand, if the value y exceeded 0.7, the high temperature toughness and the high temperature strength of the A-layer would be reduced. Therefore, the value y is set to 0.2≤y≤0.7 (in atomic ratio).

The reason for setting the preferable single layer thickness of the A-layer to 0.25 μm to 1.5 μm is that if the thickness were less than 0.25 μm, the effect of the B-layer in the stacked layer structure would be exaggerated to cause wear including micro-chipping and the a sufficient tool life as the coating film for the tools could not be obtained; and if the thickness exceeded 1.5 μm, the relatively fast wear of the A-layer would become predominant in the usage as the coating film of tools adversely and a sufficient tool life could not be obtained.

The B-layer is the mixed layer of: the layer having the same composition as the Ti and Si compound constituting the upper layer; and the layer having the same composition as the Al and Cr compound constituting the A-layer in a manner. Thus, the B-layer has the combination of the property of the Ti and Si compound layer and the property of the Al and Cr compound layer.

The preferable single layer thickness of the layer B is set to 0.25 μm to 2.5 μm. The reason for this is that: if the thickness is less than 0.25 μm, the effect of the A-layer in the stacked layer structure would be exaggerated, the relatively fast wear of the A-layer would become predominant in the usage as the coating film of tools adversely and a sufficient tool life could not be obtained; and if the thickness exceed 2.5 μm, it would cause wear including micro-chipping in the usage as the coating film of the tools and the a sufficient tool life could not be obtained.

The lower layer is constituted as the multilayer hard film of the A-layer(s) and the B-layer(s). In the case where one pair is defined as the combination of a single A-layer and a single B-layer, the lower layer is constituted by the multilayer hard film made of repeated pair in the range of 2 to 8 pairs.

The reason of this configuration is that if the number of repetition in the multilayer hard film were less than 2 or exceeded 8, the tool life of the tool would be shortened in the high-speed cutting as demonstrated in Examples explained later.

At least one layer among the A-layers; and at least one layer among the B-layers may further include at least one component element selected from W, V, Mo, Nb, Ta, Hf, and Zr; or Si as an additional component.

In addition, the content amount of the above-described additional component in the B-layers can be adjusted by including at least one component element selected from W, V, Mo, Nb, Ta, Hf, and Zr; or Si as an additional component at 0.5 atomic % to 25 atomic % as the total amount in at least one layer among the A-layer; and B-layers In this case, the content amount of the additional component at 0.5 atomic % to 25 atomic % is the amount contained by substituting a part of the content amount of Cr, for example.

By including the additional component in the A and B-layers, the wear resistance of the multilayer hard film is improved; the wear on the flank face is suppressed; and the lubricity is improved. As a result, the discharging property of chips improves. Therefore, the multilayer hard film including the above-explained additional component is suitable for the multilayer hard film of the drills, for example.

In depositing the B-layer, the periodical composition fluctuation of the component element excluding the element X can be formed in the B-layer by simultaneous deposition using the Al—Cr alloy target having a predetermined composition and the Ti—Si alloy target having a predetermined composition.

By forming this periodical composition fluctuation, the hardness of the B-layer can be improved and the stress relaxation effect in the layers can be obtained at the same time. Thus, occurrence and progress of cracks due to loads in cutting work are suppressed; and the tools can exhibit much more excellent chipping resistance, the fracturing resistance, and the wear resistance as demonstrated in Examples explained later.

FIG. 2(a) shows a cross-sectional Scanning Electron Microscope (SEM) image of the multilayer hard film in which the B-layer having the periodical composition fluctuation is formed. FIG. 2(b) shows an enlarged view of the A and B-layers. FIG. 2(c) shows a schematic diagram of the B-layer.

FIG. 2(a) shows the multilayer hard film having the lower layer made of three pairs of the A and B-layers, on which the upper layer is formed.

In the enlarged view shown in FIG. 2(b), the layer thickness of the single A-layer is 0.25 μm and the layer thickness of the single B-layer is 0.38 μm.

The schematic diagram of the B-layer shown in FIG. 2(b) is shown in FIG. 2(c).

In FIGS. 2(a) to 2(c), N is included in each layer as the element X.

The B-layer shown in FIG. 2(c) is the mixed layer of $(Ti_zSi_{1-z})X$ and the $(Al_yCr_{1-y})X$. In FIG. 2(c), the B-layer is not layer with a uniform component composition in the entire B-layer; and each of the region having a high Ti and Si composition ratio; and the region having a high Al and Cr composition ratio is formed in a striped pattern in the B-layer.

In regard with the B-layer in which the striped pattern is formed, by performing compositional analysis along with the layer thickness direction using Transmission Electron Microscopy-Energy Dispersive X-ray Spectroscopy (TEM-EDS), formation of the periodical composition fluctuation of at least one component element constituting the B-layer is confirmed in the B-layer having layer thickness of 0.38 μm, such as the periodical composition fluctuation of the Ti component. In addition, it is confirmed that the cycle width is about 100 nm in the case where the cycle width of the periodical composition fluctuation (nm) is obtained as the thickness between the location having the local maximum content of the component and the adjacent location having the local maximum content of the component; and the composition fluctuation ratio, $\eta=(C_1-C_2)\times 100/C_1$, of the periodical composition fluctuation is in the range of 5 to 95%.

$C_1$ is the local maximum content of the Ti component in the periodical composition fluctuation; and $C_2$ is the local minimum content of the Ti component in the periodical composition fluctuation. The ratio (%), in which the difference between $C_1$ and $C_2$ is divided by $C_1$, is defined as the compositional change ratio η.

The periodical composition fluctuation changes physical characteristics of the layer, such as hardness and elastic modulus. The appropriate range of the cycle width is 20 nm to 200 nm. If the cycle width were less than 20 nm, not only obtaining composition fluctuation would be difficult, but also the modulation of the physical characteristics would be small; and the significant extension effect of the life of tools could not be obtained. In addition, if the cycle width exceeded 200 nm, not only the cycle width of the composition fluctuation would be too long, but also the width of the fluctuation of the physical characteristics would be too long; and the significant extension effect of the life of tools could not be obtained.

In the present invention, by forming the multilayer hard film on the surface of the cutting tool body, the cutting tool exhibits excellent wear resistance for a long time usage without chipping, fracturing, or the like in any one of the normal (low-speed) cutting and the high-speed cutting. In order to improve adhesion strength between the cutting tool body and the multilayer hard film, the bottom layer may be formed between the cutting tool body and the multilayer hard film.

The bottom layer may be formed as a stacking layer of the A-layer having the layer thickness of 0.05 μm to 1.5 μm and the B-layer having the layer thickness of 0.05 μm to 2.5 μm as shown in FIG. 1, for example.

Deposition Method:

Deposition of the multilayer hard film of the coated tools of the present invention can be deposited by the physical vapor deposition method using AIP apparatus having multiple types of cathode electrodes (evaporation sources) in the apparatus as shown in FIG. 3, for example.

(1) As shown in FIG. 3, the revolving rotation table is provided in AIP apparatus. Cutting tool bodies made of WC-based cemented carbide are attached rotatably on positions, which apart from the center axis on the rotation table in the radial direction in a predetermined distance, along the outer peripheral part. Multiple cathode electrodes (evaporation sources) are arranged across the rotation table.

For example, 4 electrodes made of Al—Cr alloy with a predetermined composition and 2 electrodes made of Ti—Si alloy having a predetermined composition are arranged in AIP apparatus in such a way that they have the positional relationship shown in FIG. 3.

(2) Deposition of the Bottom Layer:

In order to deposit the bottom layer of the coated tool of the present invention by the above-described AIP apparatus, a predetermined reaction gas is introduced in the apparatus; arc discharge is generated only between the Al—Cr alloy with the predetermined composition and the anode electrode; and the A-layer of the lower layer having a predetermined layer thickness is deposited on the surface of the cutting tool body, for example.

Next, by co-deposition (codepo) in which arc discharge is generated between the Al—Cr alloy having the predetermined composition and the anode electrode; and between Ti—Si alloy having the predetermined composition and the anode electrode at the same time, the B-layer having a predetermined layer thickness is deposited on the surface of the A-layer formed on the surface of the cutting tool body (the mixed layer of $(Al_yCr_{1-y})X$ and $(Ti_zSi_{1-z})X$).

(3) Deposition of the Lower Layer:

Next, in order to deposit the A-layer of the lower layer, a predetermined reaction gas is introduced in the apparatus; arc discharge is generated only between the Al—Cr alloy with the predetermined composition and the anode electrode; and the A-layer having a predetermined layer thickness is deposited on the surface of the bottom layer.

In addition, in order to deposit the B-layer of the lower layer, a predetermined reaction gas is introduced in the apparatus; and by co-deposition (codepo) in which arc discharge is generated between the Al—Cr alloy having the predetermined composition and the anode electrode; and between Ti—Si alloy having the predetermined composition and the anode electrode at the same time, the B-layer having a predetermined layer thickness is deposited on the surface of the A-layer formed on the surface of the cutting tool body (the mixed layer of $(Al_yCr_{1-y})X$ and $(Ti_zSi_{1-z})X$ shown by "(TiAlCrSi)X" in FIG. 1).

Deposited lower layer can be formed by repeating deposition of the A-layer and B-layer of the lower layer alternatingly until a predetermined layer thickness is obtained.

In regard with the cycle width of the periodical composition fluctuation and the composition fluctuation ratio during deposition of the B-layer of the bottom layer and the B-layer of the lower layer, they can be controlled by adjusting the rotation speed of the rotation table; choosing appropriate numbers and locations of the multiple cathodes in AIP apparatus; adjusting the ON-OFF timing of arc discharge; and the like.

(4) Deposition of the Upper Layer:

In order to deposit the upper layer, a predetermined reaction gas is introduced in the apparatus; arc discharge is generated only between the Ti—Si alloy with the predetermined composition and the anode electrode; and the upper layer having a predetermined layer thickness is deposited on the surface of the lower layer.

The kinds of the reaction gases are needed to be chosen depending on the kinds of the X element during deposition of the lower layer and the upper layer. In the case where N, C, B, or O is included as the X element, a reaction gas containing $N_2$, $CH_4$, $C_3H_9B$, or $O_2$ may be used, respectively, as the reaction gas, for example.

In addition, in the case where at least any one component element selected from W, V, Mo, Nb, Ta, Hf, and Zr; or Si is further included in the multilayer hard film, alloy, which is the Al—Cr alloy containing the above-mentioned component element, may be used as the cathode electrode for forming the A-layer, for example.

ADVANTAGEOUS EFFECTS OF INVENTION

In the multilayer hard film-coated cutting tool of the present invention, the upper layer of the multilayer hard film is constituted by $(Ti_zSi_{1-z})X$ layer (z is in atomic %, and $0.7 \leq z \leq 0.99$) having the layer thickness of 0.075 μm to 1.5 μm; the lower layer of the multilayer hard film is constituted by the alternatingly stacked layer of the A-layer made of $(Al_yCr_{1-y})X$ layer (y is in atomic %, and $0.2 \leq y \leq 0.7$) and the B-layer made of the mixed layer of the $(Ti_zSi_{1-z})X$ layer and the $(Al_yCr_{1-y})X$ layer, a layer thickness of the B-layer is equal to or thicker than a layer thickness of the A-layer, a ratio of the layer thicknesses of the A-layer and the B-layer being A-layer:B-layer=1:1 to 1:2; and the lower layer is constituted by the multi-layered film of the A-layer and the B-layer having 2 to 8 pairs of the A-layer and the B-layer in a case where the single pair is defined by the combination of the single A-layer and a single B-layer. By having the configurations described above, the coated tool of the present invention exhibits excellent wear resistance without chipping, fracturing, or the like even in any condition of the normal (low-speed) cutting condition and the high-speed cutting condition; and it is less likely for anomalous damages such as chipping, fracturing, and the like to occur even if the upper layer is thickened. Thus, the coated tool of the present invention obtain excellent cutting performance for a long time use; and the coated tool having broad utility can be obtained.

Furthermore, in the B-layer, in the case where the periodical composition fluctuation is formed with the predetermined cycle width and the predetermined composition fluctuation ratio, the chipping resistance; the fracturing resistance; and the wear resistance are further improved, and the life of the coated tool can be extended.

DETAILED DESCRIPTION OF THE INVENTION

Next, the coated tool of the present invention is more specifically explained by Examples.

In Examples below, explanation is made about drills coated by the multilayer hard film. However, the present invention is applicable to coated tools such as inserts attached to the tip of the holder used for turning and planing; solid-type end mills used for facing, grooving, shouldering, and the like of works; insert-type end mills; and the like.

EXAMPLE 1

First, the raw material powders including the WC powder, the Co power, and the like were blended into predetermined blending compositions. Then, they were wet-mixed with ball mills. After drying, they were subjected to press-molding at pressure of 100 MPa to obtain green compacts. Then, the green compacts were sintered in the condition of: in a vacuum of 6 Pa; at the temperature of 1400° C.; and the retention time of 1 hour to form round bar sintered materials made of WC-based cemented carbide having the diameter of 13 mm. Then, drill bodies made of WC-based cemented carbide (hereinafter, referred as "the drill body") were produced from these round bar sintered materials, by grinding process. The drill body had the groove forming section with the dimension of 8 mm of the diameter and 22 mm of the length each; and the two-blades shape having the twist angle of 30°.

The component compositions of the produced drill bodies were 90 mass % of tungsten carbide (WC); and 10 mass % of cobalt (Co).

Next, honing was performed on cutting edges of these drills. Then, they were subjected to ultrasonic cleaning in acetone and drying.

Figure 1:
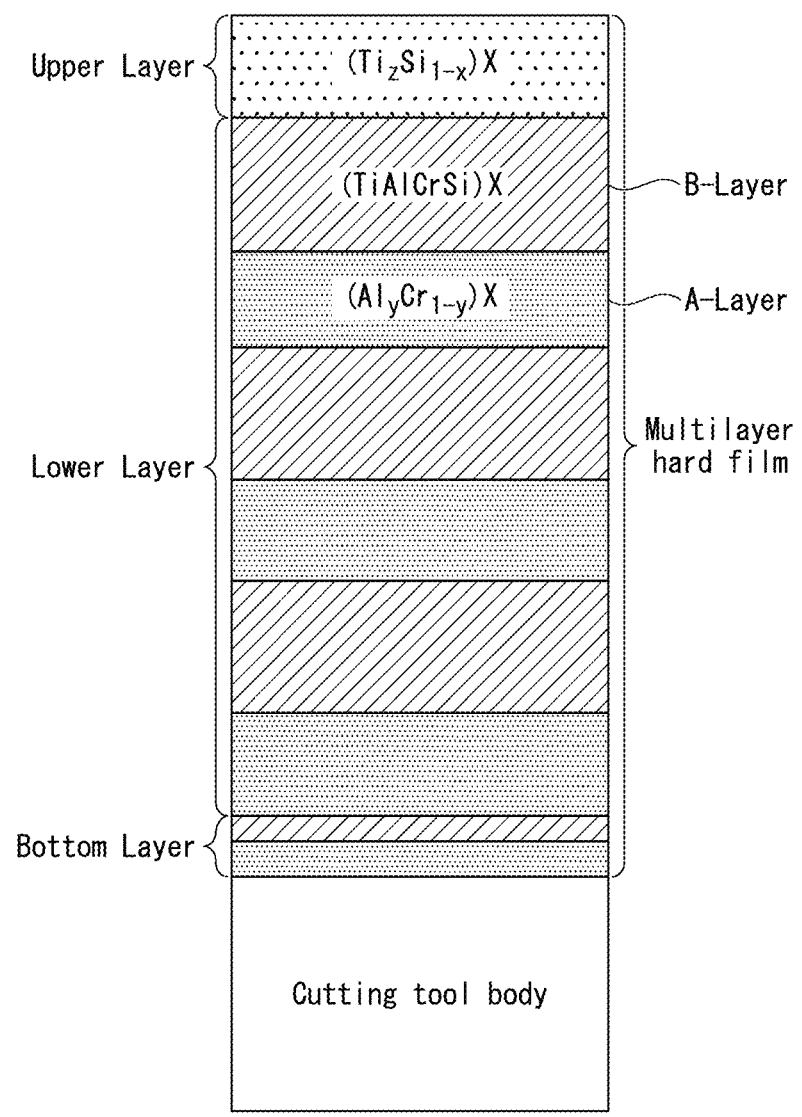
FIG. 1 is a schematic view of the cross section of the multilayer hard film of the coated tool of the present invention having a multilayer hard film FIG. 2 (a) shows a cross-sectional SEM image of the multilayer hard film in which the B-layer having the periodical composition fluctuation is formed.
Figure 2:
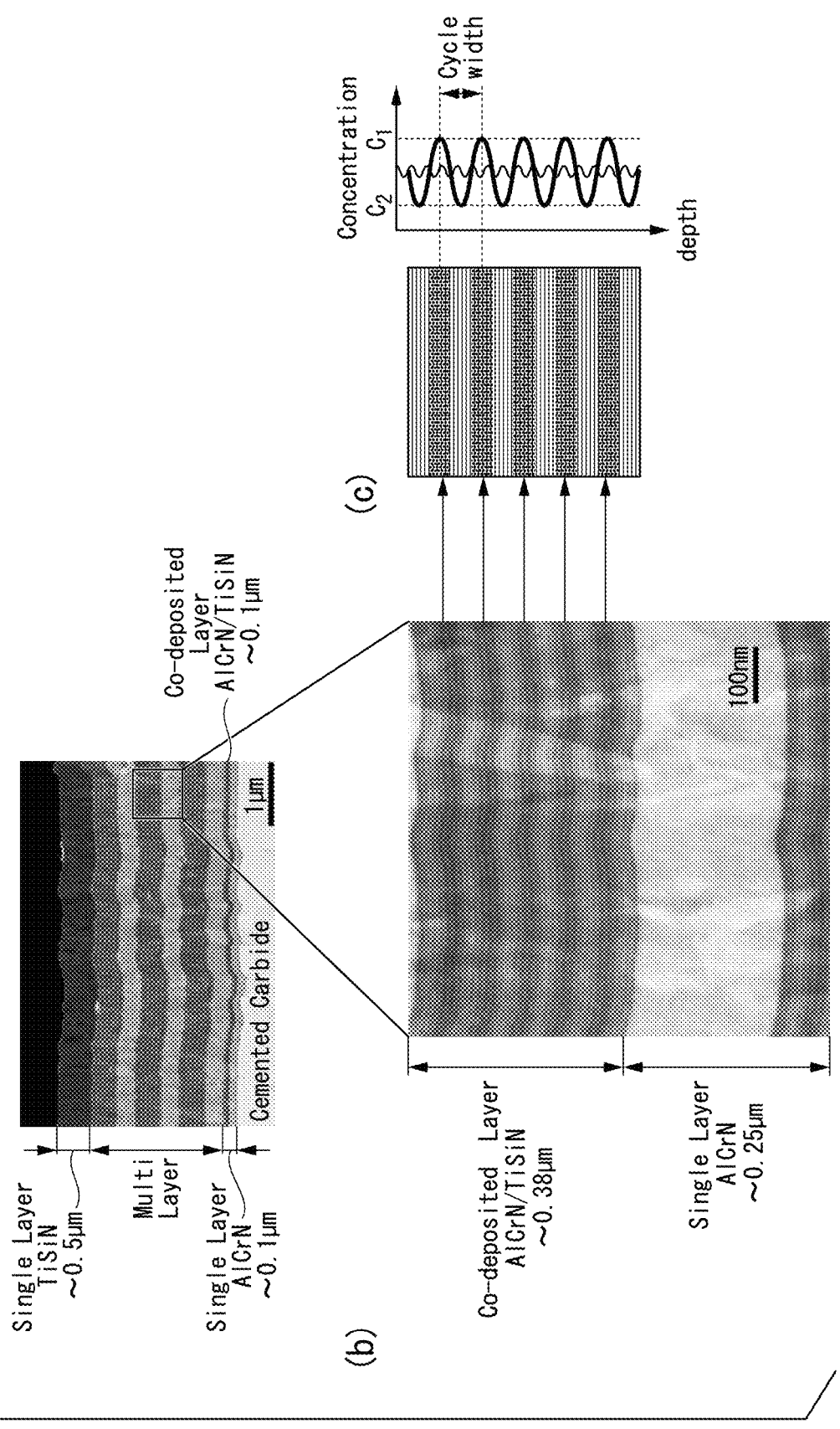
FIG. 2(b) shows an enlarged view of the A and B-layers.
FIG. 2(c) shows a schematic diagram of the B-layer.
Figure 3:
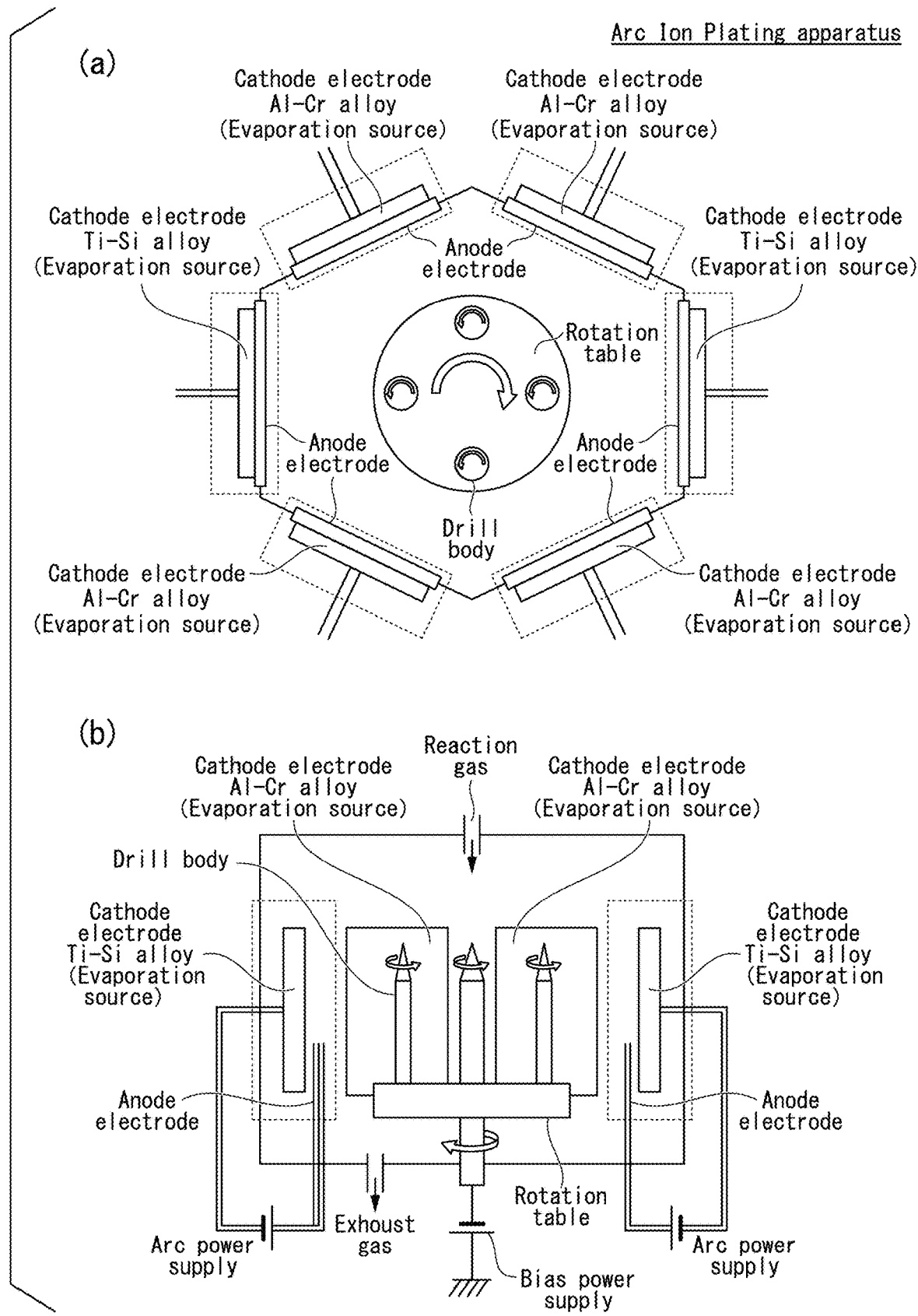
FIGS. 3(a) and 3(b) show a schematic plan view and the front view of AIP apparatus used for forming the multilayer hard film on the surface of drills, respectively.

The drill bodies produced as described above were inserted into AIP apparatus shown in FIG. 3; and the multilayer hard films shown in Table 1 were deposited on them.

Specifically, following steps were performed.

(a) The drill bodies were attached on the locations, which were apart from the central axis on the rotation table in the AIP apparatus shown in FIG. 3 in the predetermined length, along with the outer peripheral part. In AIP apparatus, 4 cathode electrodes (evaporation source) made of Al—Cr alloy having the predetermined compositions and 2 cathode electrodes (evaporation source) made of Ti—Si alloy having the predetermined compositions were arranged across the rotation table.

(b) First, the inside of the apparatus was heated by a heater to 500° C., while the inside of the apparatus was maintained in a vacuum of 0.1 Pa or less by exhausting. Then, the direct current voltage of −1000V was applied to the rotating cutting tool bodies revolving on the rotation table rotating at the rotation speed of 0.5 rpm to 5 rpm; and the arc discharge was generated by flowing current of 100 A between the Al—Cr alloy and the anode electrode. By performing the above-explained process, the surfaces of the drill bodies were subjected to bombard cleaning.

(c) Then, the atmosphere in the apparatus was maintained in the nitrogen atmosphere of 0.5 Pa to 9.0 Pa. The direct current bias voltage of −20V to −150V was applied to the rotating cutting tool bodies revolving on the rotation table; and the arc discharge was generated by flowing current of 120 A between the Al—Cr alloy electrode and the anode electrode. By performing the above-explained process, the (Al$_y$Cr$_{1-y}$)N layers having the intended compositions and the intended layer thicknesses shown in Table 1 were formed by vapor deposition.

(d) Then, by continuing the arc discharge between the Al—Cr alloy electrode and the anode electrode; and by generating arc discharge by flowing current of 120 A between the Ti—Si alloy electrode and the anode electrode, the mixed layers having the intended layer thicknesses, which were formed by the simultaneous vapor deposition of the (Al$_y$Cr$_{1-y}$)N layer and the (Ti$_z$Si$_{1-z}$)N layer, were formed. By performing the above-described processes (c) and (d), the bottom layers were formed.

(e) Then, the atmosphere in the apparatus was maintained in the nitrogen atmosphere of 0.5 Pa to 9.0 Pa. The direct current bias voltage of −20V to −150V was applied on the rotating drill bodies revolving on the rotation table; and the arc discharge was generated by flowing current of 120 A between the Al—Cr alloy electrode and the anode electrode. By performing the above-described process, the A-layers having the intended compositions and the intended single layer thicknesses shown in Table 1 were formed.

(f) Then, the direct bias voltage of −20V to −150V was applied on the rotating cutting tool bodies revolving on the rotation table, while the atmosphere in the apparatus was maintained in the nitrogen atmosphere of 0.5 Pa to 9.0 Pa. At the same time, by continuing the arc discharge by flowing current between the Al—Cr alloy and the anode electrode; and by generating arc discharge by flowing current of 120 A between the Ti—Si alloy electrode and the anode electrode, the mixed layers (B-layers) having the intended single layer thicknesses shown in Table 1, which were formed by the simultaneous vapor deposition of the (Al$_y$Cr$_{1-y}$)N layer and the (Ti$_z$Si$_{1-z}$)N layer, were formed.

(g) By repeating the above-described processes (e) and (f), the lower layers, which had the number of repeated pairs in the range of 1 pair to 20 pairs and the intended layer thicknesses shown in Table 1, were formed, 1 pair being defined by a layer made of one A-layer and one B-layer.

(h) Next, the atmosphere in the apparatus was maintained in the nitrogen atmosphere of 0.5 Pa to 9.0 Pa. The direct current bias voltage of −20V to −150V was applied to the rotating drill bodies revolving on the rotation table; and the arc discharge was generated by flowing current of 120 A between the Ti—Si alloy electrode and the anode electrode. By performing the above-explained process, the upper layers having the intended compositions and the intended layer thicknesses shown in Table 1 were formed.

By forming the multilayer hard films having the predetermined layer thicknesses shown in Table 1 by vapor deposition by performing the above-described processes (a) to (h), the testing drills 1 to 8 were produced as multilayer hard film-coated tools.

The element X in the hard films of the testing drills 1 to 8 produced as described above was N (nitrogen) in each of them.

In order to evaluate characteristics of the testing drills 1 to 8, the coated tool proposed in Japanese Unexamined Publication No. 2014-87858 was produced by using AIP apparatus and used as the conventional drill 1 for evaluation criteria.

In the production of the conventional drill 1, the inside of the apparatus was maintained in the nitrogen gas atmosphere, and the multilayer hard film shown in Table 2 was formed by vapor deposition by using the Al—Ti alloy electrode and the Al—Cr alloy electrode as cathode electrodes.

In addition, the coated tool proposed in Japanese Patent No. 3705381 was produced by using AIP apparatus, and used as the conventional drill 2.

In the production of the conventional drill 2, the inside of the apparatus was maintained in the nitrogen gas atmosphere, and the multilayer hard film shown in Table 2 was formed by vapor deposition by using the Ti electrode and the Ti—Al alloy electrode as cathode electrodes.

In regard with the testing drills 1 to 8 produced as described above and the conventional drills 1 and 2, each layer thickness of multilayer hard films were directly measured by SEM after performing ion-etching on cutting edges. Component compositions thereof were obtained by measurement of TEM-EDS at multiple points for each thickness of films and by averaging obtained values. Cycle widths of periodical composition fluctuation were obtained based on the relationship between the above-described measurement values and film thicknesses as the thickness distance between the location showing the local maximum content of each component element and the adjacent location showing the local maximum content. The composition fluctuation ratios were obtained as the ratio in which the difference of the local maximum content and the local minimum content was divided by the local maximum content.

The cycle widths and the composition fluctuation ratio were calculated based on the measurement values of the Ti component.

Results are shown in Tables 1 and 2.

The testing drills 1 to 8 and the conventional drills 1 and 2 were subjected to the cutting test in the cutting condition A described below.

Cutting Condition A (High-Speed Cutting):
  Work: JIS S50C plate having the planar dimension of 100 mm×250 mm;
thickness of 25 mm
  Cutting speed: 200 m/min
  Feed: 0.35 mm/rev.
  Depth of hole: 25 mm
  Coolant: Water-soluble cutting oil, 1 MPa Wet high-speed drilling cutting test on carbon steel was performed under the cutting condition A shown above.

The cutting test was interrupted when the cutting length reached to 57.0 m in intermediate stages of the cutting test in each drill, and the wear state on the cutting edges were observed.

Figure 4:
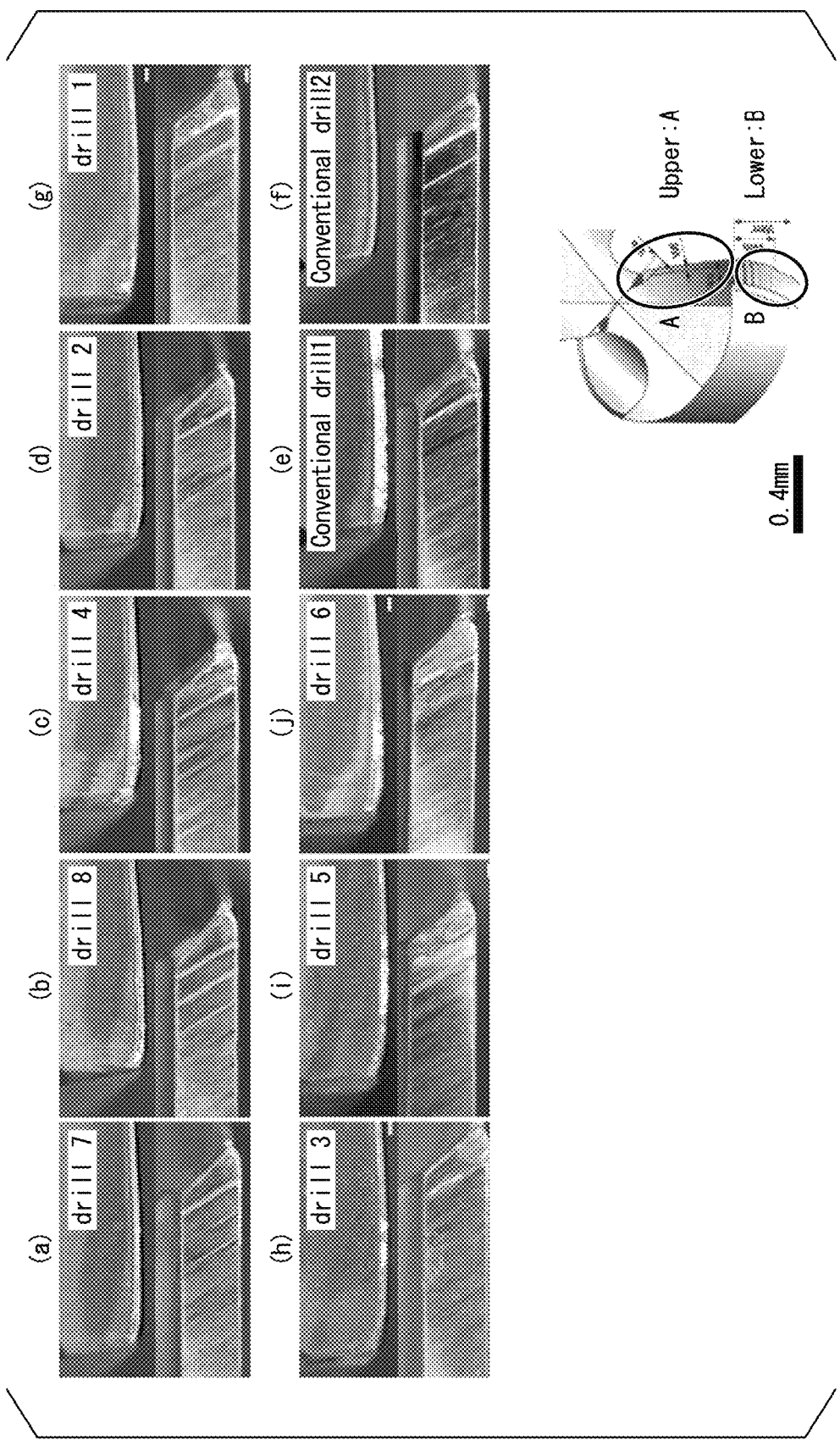
FIGS. 4(a) to 4(j) are photographic images for observing the wear state on a cutting edge of each drill in intermediate stages (to the point where the cutting length reaches to 57.0 m) in the cutting test in the cutting condition A (fast cutting).

Observation results are shown in FIG. 4.

Then, the cutting test was continued, and the cutting lengths until they reached to their tool lives were obtained. In the test, the tool life was defined by the when the wear width on the flank face on the cutting edge exceeded 0.3 mm.

The location, on which the wear width on the flank face was measured, was the location 0.5 mm from the outermost periphery of each drill toward the center of the drill.

The results are shown in Table 3.

In addition, the wear state of the cutting edge of the drill reached to its tool life was observed in the testing drills 1 to 8 and the conventional drills 1 to 2.

Figure 5:
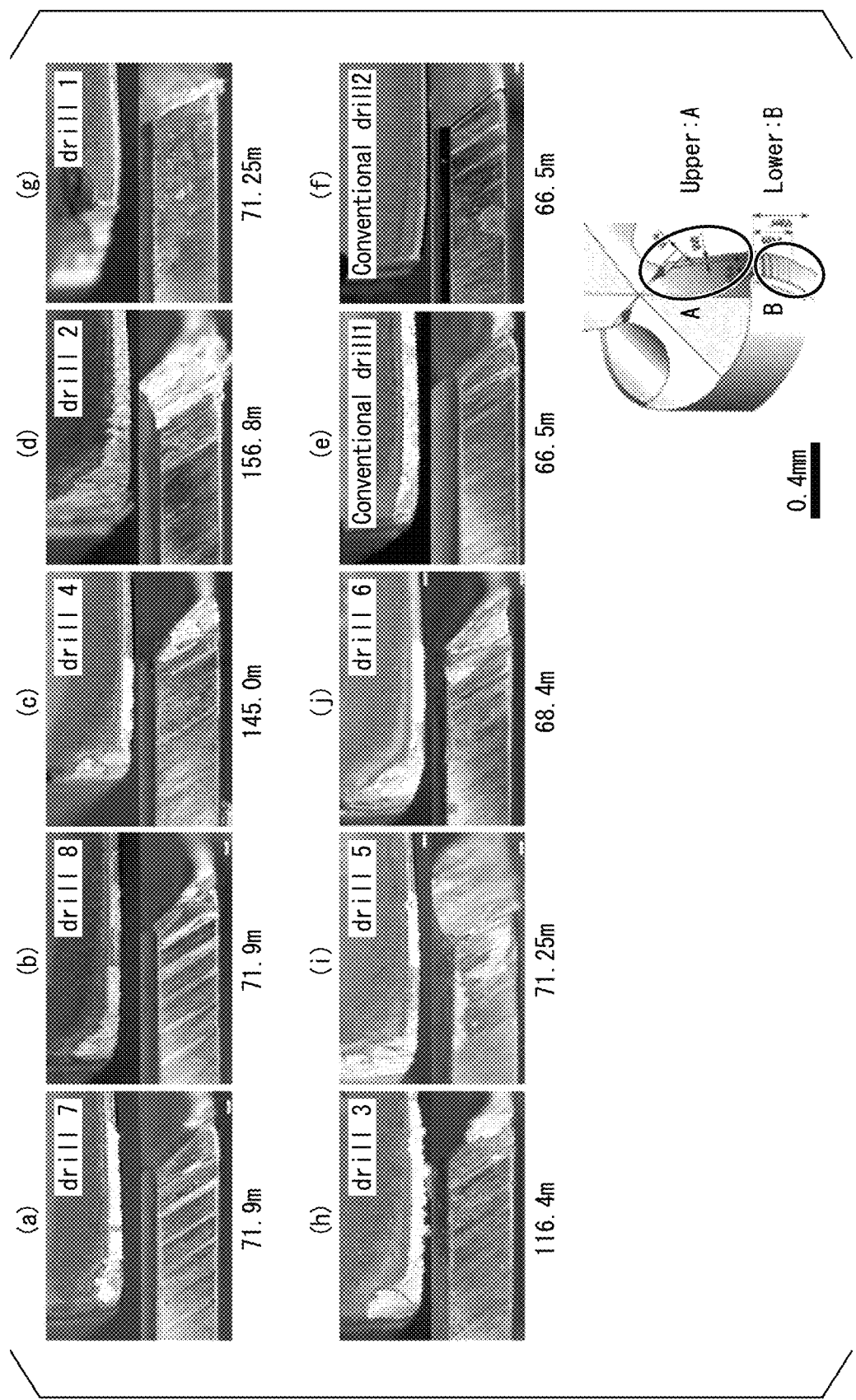
FIGS. 5(a) to 5(j) are photographic images for observing the wear state on a cutting edge of each drill reached to the tool life in the cutting test in the cutting condition A (fast cutting).

Observation results are shown in FIG. 5.

According to FIG. 4, as understood from the photographic image of the A part, the wear width in the conventional drill 1 was 1.5 times to those of the testing drills 2 to 4 and significantly large. In the conventional drill 2, the wear width was at a similar level. However, as understood from the photographic image of the B part, wear on the margin was significant.

As a result, as shown in FIG. 5, the conventional drill 1 was fractured due to weakening of the cutting edge because of progress of wear on the flank face. The conventional drill 2 was short lived compared to the testing drills 2 to 4 (corresponding to the drill of the present invention) due to increase of cutting resistance because of progress of wear on the margin.

Comparison between the testing drills 2 to 4 (drills of the present invention); and the testing drill 1 and the testing drills 5 to 8 (Comparative Examples (C. Ex.)), is explained below. First, in regard with the effect of the wear width on the flank face, there was not much difference between the testing drills 2 to 4; and the testing drill 1 and the testing drills 5 to 8.

In addition, the testing drill 1 and the testing drills 5 to 8 had similar or a bit longer tool life to the conventional drills. However, the testing drill 1 and the testing drills 5 to 8 were inferior to the testing drills 2 to 4 in a sense that chipping in a submillimeter-scale occurred in the vicinity of the cutting edge at multiple locations in each of them due to the effect of the residual stress in the films at the early stage of the cutting; and the quality of the drilled hole was low as shown in FIG. 5. The reasons for being affected by the residual stress in the films can be: there were many interfaces due to having many repeated pairs of the A-layer and the B-layer; and they had too many interfaces and the layer thicknesses of TiSiN of the upper layer were relatively thick particularly in the testing drills 7 and 8.

In addition, testing drills 1 to 8 and the conventional drills 1 and 2 were subjected to the cutting test in the cutting condition B described below.

Cutting Condition B (Normal (Low) Speed Cutting):
Work: JIS S50C plate having the planar dimension of 100 mm×250 mm;
thickness of 25 mm
  Cutting speed: 120 m/min
  Feed: 0.25 mm/rev.
  Depth of hole: 25 mm
  Coolant: Water-soluble cutting oil, 1 MPa
Wet high-speed drilling cutting test on carbon steel was performed under the cutting condition B shown above.

The cutting test was interrupted when the cutting length reached to 66.5 m in intermediate stages of the cutting test in each drill, and the wear state on the cutting edges were observed.

Figure 6:
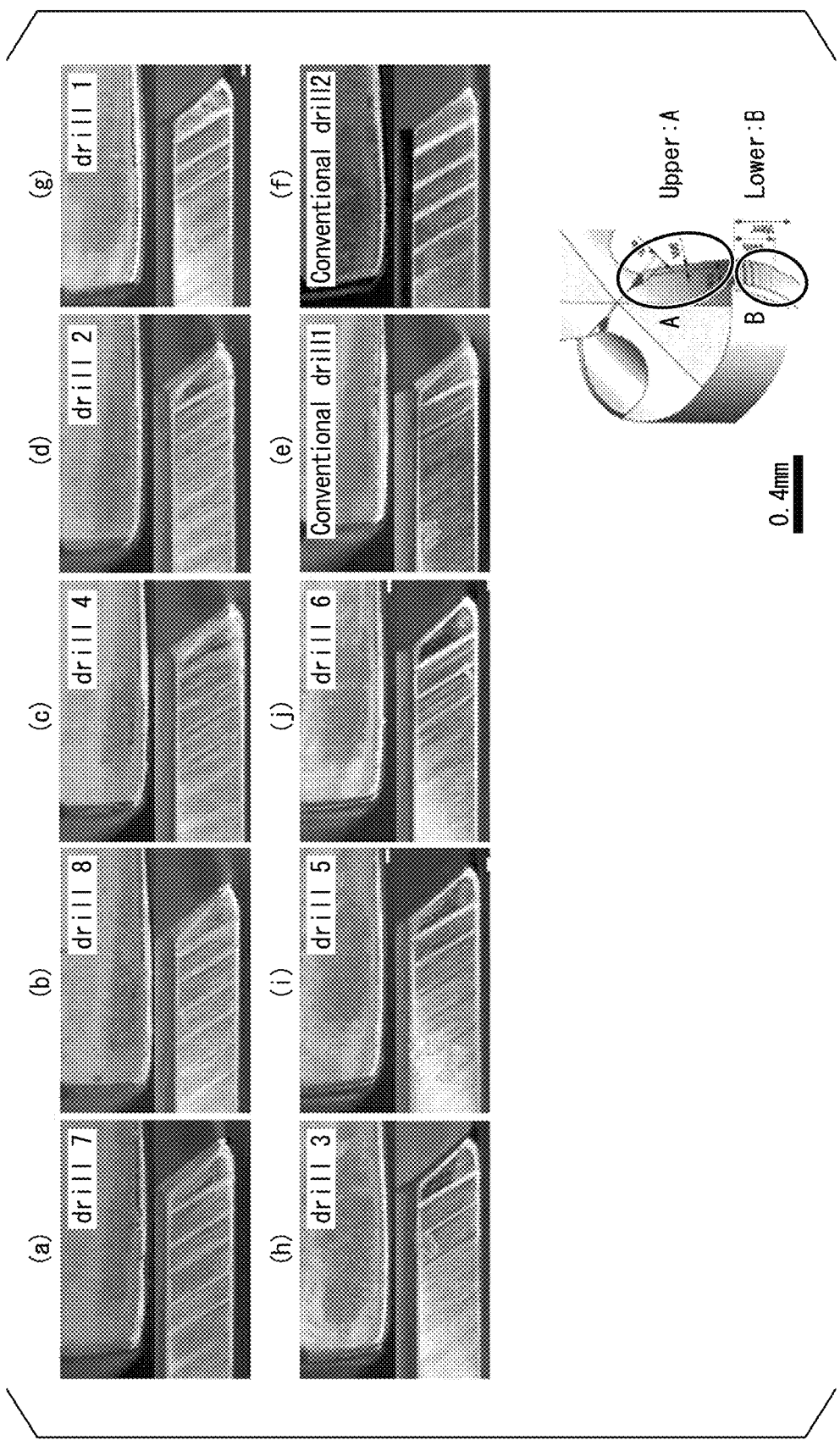
FIGS. 6(a) to 6(j) are photographic images for observing the wear state on a cutting edge of each drill in intermediate stages (to the point where the cutting length reaches to 66.6 m) in the cutting test in the cutting condition B (normal (low-speed) cutting).

Observation results are shown in FIG. 6.

Then, the cutting test was continued, and the cutting lengths until they reached to their tool lives were obtained. In the test, the tool life was defined by the when the wear width on the flank face on the cutting edge exceeded 0.3 mm.

The location, on which the wear width on the flank face was measured, was the location 0.5 mm from the outermost periphery of each drill toward the center of the drill.

The results are shown in Table 4.

In addition, the wear state of the cutting edge of the drill reached to its tool life was observed in the testing drills 1 to 8 and the conventional drills 1 to 2.

Figure 7:
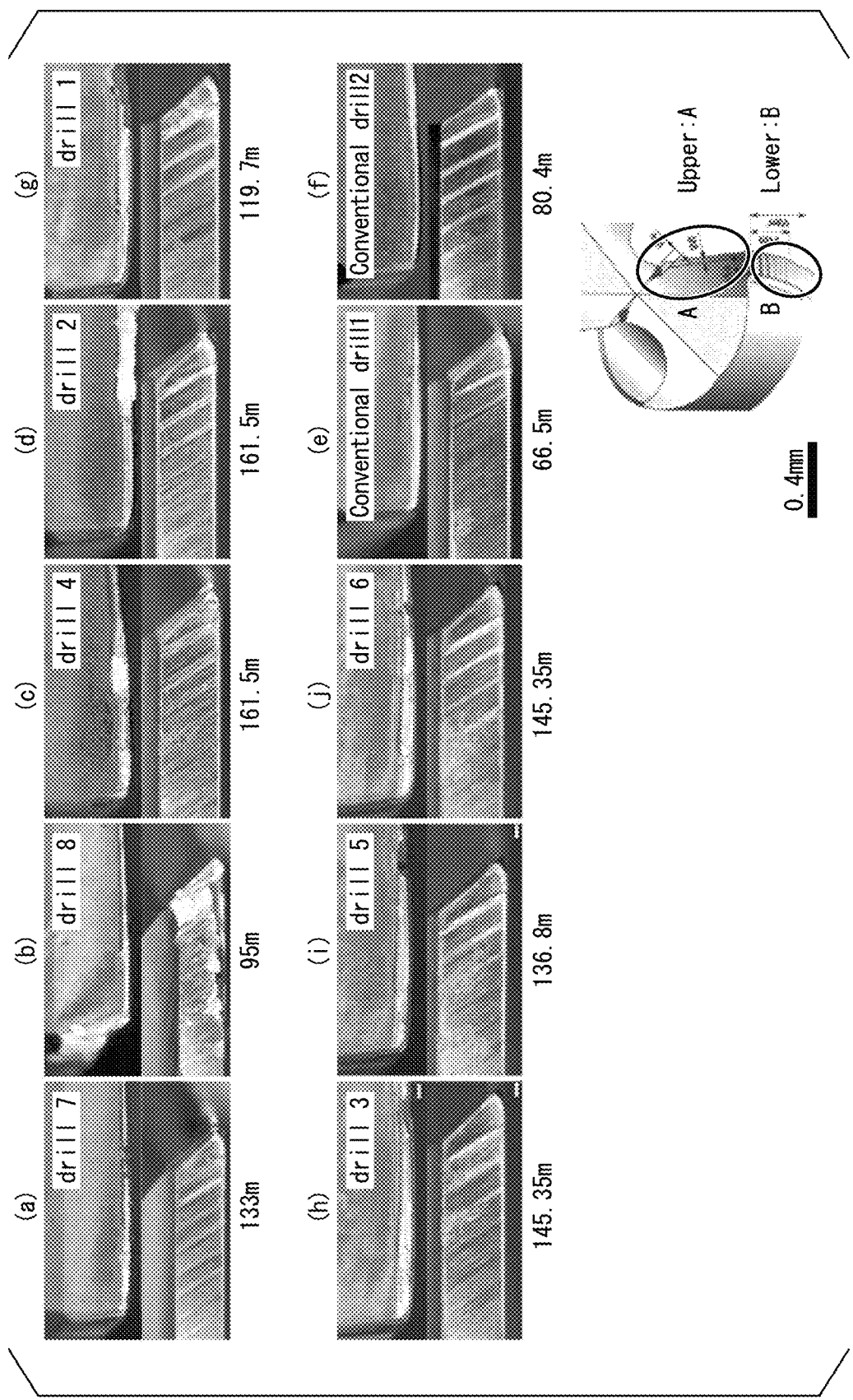
FIGS. 7(a) to 7(j) are photographic images for observing the wear state on a cutting edge of each drill reached to the tool life in the cutting test in the cutting condition B (normal (low-speed) cutting).

Observation results are shown in FIG. 7. Some of the testing drills 1 and 5 to 8 had the tool life significantly longer than that of the conventional drills. However, similar to the tests in the cutting condition A, the testing drill 1 and the testing drills 5 to 8 were inferior to the testing drills 2 to 4 in a sense that chipping in a submillimeter-scale occurred in the vicinity of the cutting edge at multiple locations in each of them due to the effect of the excessive residual stress in the films at the early stage of the cutting; and the quality of the drilled hole was low as shown in FIG. 5. The reasons for being affected by the excessive residual stress in the films can be: there were many interfaces due to having many repeated pairs of the A-layer and the B-layer; and they had too many interfaces and the layer thicknesses of TiSiN of the upper layer were relatively thick particularly in the testing drills 7 and 8 similar to the cutting test A.

TABLE 1

| | | Bottom layer | | | | Lower layer | | | | | |
|---|---|---|---|---|---|---|---|---|---|---|---|
| | | Mixed layer of | | | | | | B-layer | | | |
| | | $(Al_yCr_{1-y})N$ layer | | $(Al_yCr_{1-y})$ and $(Ti_zSi_{1-z})N$ | | A-layer | | | | Periodical composition | |
| | | Intended | | Intended | | Intended | | | | fluctuation | |
| Type | | Al content amount (y value) | layer thickness (μm) | Al content amount (y value) | Ti content amount (z value) | layer thickness (μm) | Al content amount (y value) | single layer thickness (μm) | Al content amount (y value) | Ti content amount (z value) | Cycle width (nm) | C1 [Ti] (atomic %) |
| Testing drills | 1 | — | — | 0.6 | — | 0.1 | — | — | 0.7 | 0.85 | 12 | 16.1 |
| | 2 | 0.7 | 0.1 | 0.7 | 0.85 | 0.1 | 0.7 | 0.35 | 0.7 | 0.85 | 100 | 30.1 |
| | 3 | 0.6 | 0.1 | 0.6 | 0.85 | 0.1 | 0.6 | 0.23 | 0.6 | 0.85 | 80 | 27.1 |
| | 4 | 0.6 | 0.1 | 0.6 | 0.85 | 0.1 | 0.6 | 0.19 | 0.6 | 0.85 | 120 | 28.0 |
| | 5 | 0.6 | 0.1 | 0.6 | 0.85 | 0.1 | 0.6 | 0.12 | 0.6 | 0.85 | 12 | 28.7 |
| | 6 | 0.6 | 0.1 | 0.6 | 0.85 | 0.1 | 0.6 | 0.1 | 0.6 | 0.85 | 12 | 17.2 |
| | 7 | 0.6 | 0.1 | 0.6 | 0.85 | 0.1 | 0.6 | 0.1 | 0.6 | 0.85 | 12 | 16.7 |
| | 8 | 0.6 | 0.1 | 0.6 | 0.85 | 0.1 | 0.6 | 0.12 | 0.6 | 0.85 | 0 | 16.5 |

| | | Lower layer | | | | | Upper layer | | |
|---|---|---|---|---|---|---|---|---|---|
| | | B-layer | | | | | $(Ti_zSi_{1-z})N$ layer | | |
| | | Periodical composition | | | | | | | |
| | | fluctuation | | Intended | | | | Intended | |
| Type | | C2 [Ti] (atomic %) | Composition fluctuation ratio (%) | single layer thickness (μm) | Ratio between A-layer and B-layer | Number of repeated pairs of A-layer and B-layer | Ti content amount (z value) | layer thickness (μm) | Remarks |
| Testing drills | 1 | 15.8 | 2.0 | 2.7 | — | 1 | 0.85 | 0.2 | Comparative Example |
| | 2 | 6.0 | 80.2 | 0.4 | 1:1.1 | 3 | 0.85 | 0.5 | Example of the present invention |

TABLE 1-continued

| | | | | | | | | |
|---|---|---|---|---|---|---|---|---|
| 3 | 7.3 | 73.1 | 0.25 | 1:1.1 | 5 | 0.85 | 0.2 | Example of the present invention |
| 4 | 4.9 | 82.5 | 0.21 | 1:1.1 | 5 | 0.85 | 0.5 | Example of the present invention |
| 5 | 27.9 | 2.8 | 0.13 | 1:1.1 | 10 | 0.85 | 0.2 | Comparative Example |
| 6 | 16.9 | 1.7 | 0.12 | 1:1.2 | 20 | 0.85 | 0.2 | Comparative Example |
| 7 | 16.0 | 4.2 | 0.12 | 1:1.2 | 9 | 0.85 | 1.0 | Comparative Example |
| 8 | 16.1 | 2.4 | 0.12 | 1:1.2 | 10 | 0.85 | 1.0 | Comparative Example |

TABLE 2

| | | Lower layer | | | | | | Upper layer | | |
|---|---|---|---|---|---|---|---|---|---|---|
| | | ($Al_aTi_{1-a}$)N layer | | | Periodical composition fluctuation | | Intended | ($Ti_cSi_{1-c}$)N layer | | |
| | Bottom layer | Intended Al content amount (a value) | Intended single layer thickness (μm) | Al content amount (b value) | Cycle width (nm) | Composition fluctuation ratio (%) | single layer thickness (μm) | Number of alternatingly repeated pair (pairs) | Ti content amount (c value) | Layer thickness (μm) | Total layer thickness (μm) |
| Conventional drill 1 | Not formed | 0.6 | 1 | 0.7 | No periodical composition fluctuation | | 1 | 2 | 0.85 | 0.1 | 4 |

| | | Lower layer | | | | | | | | |
|---|---|---|---|---|---|---|---|---|---|---|
| | | | | Co-vapor deposited nano layers of TiN layer and ($Al_dTi_{1-d}$)N layer | | | | | | |
| | Bottom layer | ($Al_dTi_{1-d}$)N layer | | | Periodical composition fluctuation | | Intended | Number of | Upper layer ($Al_eTi_{1-e}$)N layer | |
| | TiN layer | Intended | | Average | fluctuation | | single | repeated pair | Ti | Intended | Total |
| | Intended layer thickness (μm) | Al content amount (d value) | single layer thickness (μm) | Al content amount | Cycle width (nm) | Composition fluctuation ratio (%) | single layer thickness (μm) | repeated pair in the lower layer (pairs) | Ti content amount (e value) | Intended layer thickness (μm) | Total layer thickness (μm) |
| Conventional drill 2 | 0.1 | 0.5 | 0.1 | 0.3 | No periodical composition fluctuation | | 0.1 | 13 | 0.5 | 0.5 | 4 |

Note:
Contents a, b, c, d, and e in the above table are in atomic ratio.

TABLE 3

| Type | | Cutting length (m) | Wear state on cutting edge | Tool life ratio | | Corresponding panel in FIG. 4 (State of cutting edge in cutting length of 57 m) | Corresponding panel in FIG. 5 (State of cutting edge when it reached to the tool life) | Remark |
|---|---|---|---|---|---|---|---|---|
| | | | | Tool life ratio 1 (%) | Tool life ratio 2 (%) | | | |
| Testing drill | 1 | 71.3 | Broken | 107 | 107 | (g) | (g) | Comparative Example |
| | 2 | 156.8 | There is wear on outer peripheral | 236 | 236 | (d). | (d). | Example of the present invention |

TABLE 3-continued

| Type | | Cutting length (m) | Wear state on cutting edge | Tool life ratio Tool life ratio 1 (%) | Tool life ratio 2 (%) | Corresponding panel in FIG. 4 (State of cutting edge in cutting length of 57 m) | Corresponding panel in FIG. 5 (State of cutting edge when it reached to the tool life) | Remark |
|---|---|---|---|---|---|---|---|---|
| | 3 | 116.4 | Large wear | 175 | 175 | (h) | (h) | Example of the present invention |
| | 4 | 145.0 | Broken | 220 | 220 | (c) | (c) | Example of the present invention |
| | 5 | 71.3 | Broken | 107 | 107 | (i) | (i) | Comparative Example |
| | 6 | 68.4 | Large wear | 103 | 103 | (j) | (j) | Comparative Example |
| | 7 | 71.9 | Cracking occurred | 108 | 108 | (a) | (a) | Comparative Example |
| | 8 | 71.9 | Cracking occurred | 108 | 108 | (b) | (b) | Comparative Example |
| Conventional drill 1 | | 66.5 | Broken | 100 | 100 | (e) | (e) | Conventional Example |
| Conventional drill 2 | | 66.5 | Broken | 100 | 100 | (f) | (f) | Conventional Example |

Note:
"Tool life ratio 1" means the ratio of tool life relative to the tool life of the conventional drill 1.
"Tool life ratio 2" means the ratio of tool life relative to the tool life of the conventional drill 2.

TABLE 4

| Type | | Cutting length (m) | Wear state on cutting edge | Tool life ratio Tool life ratio 1 (%) | Tool life ratio 2 (%) | Corresponding panel in FIG. 6 (State of cutting edge in cutting length of 66.5 m) | Corresponding panel in FIG. 7 (State of cutting edge when it reached to the tool life) | Remark |
|---|---|---|---|---|---|---|---|---|
| Testing drill | 1 | 119.7 | Crack | 180 | 149 | (g) | (g) | Comparative Example |
| | 2 | 161.5 | Possible to continue cutting | 243 | 201 | (d). | (d). | Example of the present invention |
| | 3 | 145.4 | Crack | 219 | 181 | (h) | (h) | Example of the present invention |
| | 4 | 161.5 | Possible to continue cutting | 243 | 201 | (c) | (c) | Example of the present invention |
| | 5 | 136.8 | Crack | 206 | 170 | (i) | (i) | Comparative Example |
| | 6 | 145.4 | Crack | 219 | 181 | (j) | (j) | Comparative Example |
| | 7 | 133 | Broken | 200 | 165 | (a) | (a) | Comparative Example |
| | 8 | 95 | Broken | 143 | 118 | (b) | (b) | Comparative Example |
| Conventional drill 1 | | 66.5 | Broken | 100 | 83 | (e) | (e) | Conventional Example |
| Conventional drill 2 | | 80.4 | Broken | 121 | 100 | (f) | (f) | Conventional Example |

Note:
"Tool life ratio 1" means the ratio of tool life relative to the tool life of the conventional drill 1.
"Tool life ratio 2" means the ratio of tool life relative to the tool life of the conventional drill 2.

Next, the relationship between: the number of the repeated pairs of the A-layer and the B-layer in the lower layer; and the life of the tools was investigated. The layer thickness of the upper layer was fixed to the constant value of 0.2 μm; and the layer structures of the lower layer, component compositions and component compositions of the lower layer, were set to the same as other as much as possible. Under the above-described condition, multiple testing drills, in which the number of the repeated pairs of the A-layer and the B-layer in the lower layer was changed mainly, were produced. Then, these testing drills were subjected to the high-speed cutting test (the same as the cutting test on carbon steel in the cutting condition A) under the cutting speed of 200 m/min. Based on the obtained test results, the drill tool life ratio 1 of each was obtained.

Figure 8:
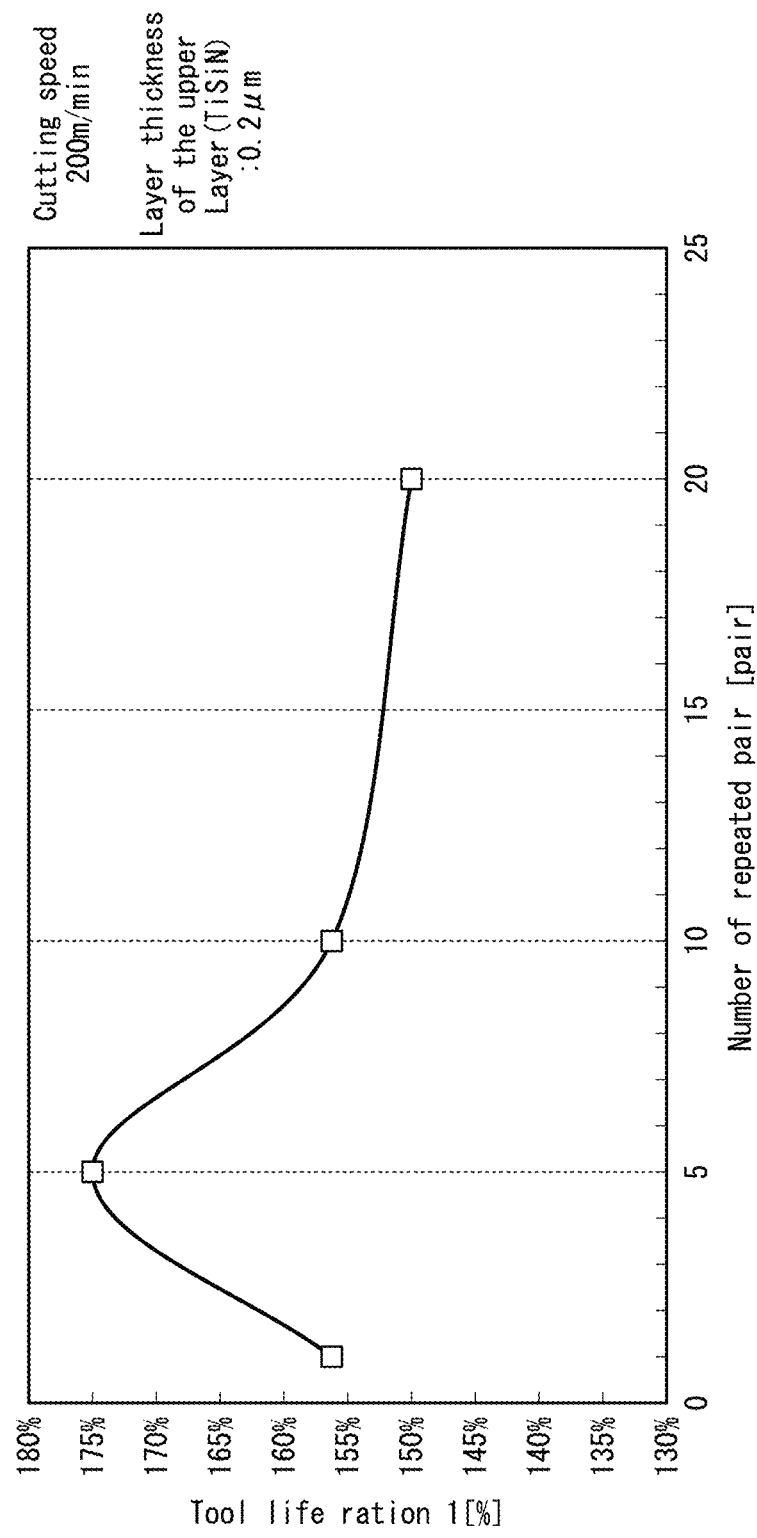
FIG. 8 is a graph showing the relationship between the number of repeated pairs of the A and B layers in the lower layer of the multilayer hard film and the tool life of the drill.

Test results (tool life ratio 1) are shown in FIG. 8. Values of the testing drills, which had the numbers of repeated pairs of 1, 5, 10, and 20, were plotted in the graph.

From FIG. 8, it was demonstrated that 160% or more of the tool life ratio 1 could be obtained in the range of 2 pairs to 8 pairs of the repeated pairs of the A-layer and the B-layer in the lower layer.

This is the reason why the number of repeated pairs of the A-layer and the B-layer in the lower layer is set to 2 pairs to 8 pairs in the present invention.

In addition, the relationship between the layer thickness of the upper layer and the tool life ratio 1 was investigated.

Multiple testing drills, in which the layer thickness of the upper layer was changed in the range of 0.075 μm to 1.5 μm, were produced in the condition where the bottom layer, the component composition, and the layer structure were identical. Then, these testing drills were subjected to the high-speed cutting test (the same as the cutting test on carbon steel in the cutting condition A) under the cutting speed of 200 m/min and the normal (low) speed cutting test (the same as the cutting test on carbon steel in the cutting condition B). Based on the obtained test results, the cutting length and the drill tool life ratio 1 of each were obtained.

Figure 9:
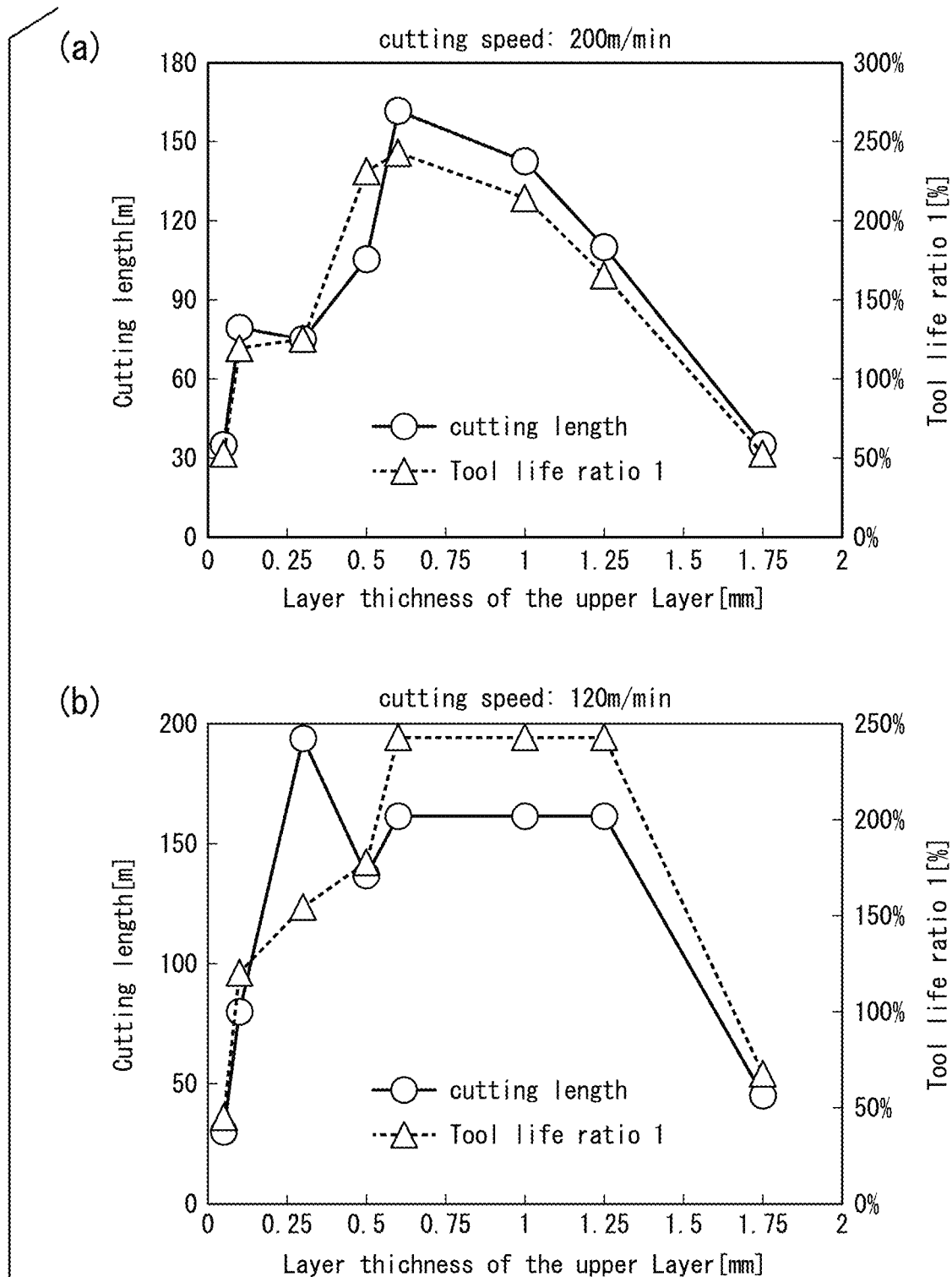
FIG. 9(a) is a graph showing the relationship between the layer thickness of the upper layer of the multilayer hard film; and the cutting length and the tool life ratio 1 in the first cutting.
FIG. 9(b) is a graph showing the relationship between the layer thickness of the upper layer of the multilayer hard film; and the cutting length and the tool life ratio 1 in the normal (low-speed) cutting.

Testing results in the high-speed cutting test (cutting length and tool life ration 1) and testing results in the normal (slow) speed cutting test (cutting length and tool life ration 1) are shown in FIG. 9(*a*) and FIG. 9(*b*), respectively. Testing results (cutting length and tool life ration 1), in which the layer thicknesses of the upper layers were set to 0.05 μm, 0.1 μm, 0.3 μm, 0.5 μm, 0.6 μm, 1 μm, 1.25 μm and 1.5 μm, were plotted in the graphs.

According to FIG. 9(*a*), in the high-speed cutting, the tool life ratio 1 exceeded 100% when the layer thickness of the upper layer became 0.75 μm or more, and the tool life ratio 1 saturated about 200 to 250% when the layer thickness of the upper layer became 0.6 μm or more. According to FIG. 9(*b*), in the normal (low-speed) cutting, the tool life ratio 1 was increased in proportion to the layer thickness of the upper layer.

In any case, when the layer thickness of the upper layer was 0.075 μm or more and 1.5 μm or less, preferably 0.2 μm or more and 1.0 μm or less, the cutting length and the tool life ratio 1 were high in any one of the high-speed cutting and the normal (low-speed) cutting. Thus, it was demonstrated that the coated tools exhibit excellent cutting performance for a long time without anomalous damages such as chipping, fracturing, or the like.

Based on the results shown in Tables 3 and 4, it was demonstrated that the multilayer hard film-coated tools (testing drills 2, 3 and 4) satisfying the configurations defined in the present invention had broad utility in any one of the high-speed cutting and the normal (low-speed) cutting, since the upper layer is constituted by the layer made of the compound containing at least Ti and Si with the predetermined composition and layer thickness; the lower layer is constituted by the multilayer film made of 2 to 8 pairs of the repeated pair of the A-layer and the B-layer; and the A-layer and the B layer are constituted by the layer of the compound containing at least Al and Cr, and the mixed layer of the compound containing at least Ti and Si and the A-layer, respectively. In addition, they exhibit excellent cutting performance for a long time without anomalous damages such as chipping, fracturing, or the like compared to the conventional drills 1 and 2.

EXAMPLE 2

Each of testing drills 9 to 38 as the multilayer hard film-coated tool was produced by forming the multilayer hard films with the predetermined layer thicknesses shown in Table 5 by vapor deposition by performing the processes (a) to (h) in Example 1 to the drill bodies made of component compositions of 90 mass % of tungsten carbide (WC) and 10 mass % of cobalt (Co).

In deposition of the testing drill 15, the element X of the hard film was CN (carbon nitride) by using the mixed gas atmosphere of $N_2$ and $CH_4$ as the atmosphere in the apparatus.

During deposition of the testing drills 16 to 18, the B-layer in the films of the testing drills 16 to 18 included Zr, Nb, and W at 1 atomic %, by using the electrode containing Zr, Nb, and W, as the Ar—Cr alloy electrode.

The layer thickness of each of layer in the multilayer hard films; component compositions; and the cycle width and composition fluctuation ratio of the periodical composition fluctuation were obtained as in Example 1 in the testing drills 9-38 produced as described above.

The results are shown in Table 5.

Testing drills 9 to 38 produced as described above were subjected to the cutting test in the same cutting conditions as in Example 1 (the cutting condition A (the high-speed cutting) and the cutting condition B (the normal (low-speed) cutting)).

Then, the evaluation of characteristics of the testing drills 9 to 38 were performed by comparing to the conventional drills 1 and 2 used in Example 1 shown in Table 2.

Results of the cutting tests are shown in Tables 6 and 7.

Based on the test results in the cutting condition A shown in Table 6, wear of the hard film including the margin part was fast in the testing drill 9, which was Comparative Example. In addition, the testing drill 9 was short-lived with the tool life ratio of 76% relative to the tool lives of the conventional drills 1 and 2. Cracks were formed in coating films in the early stage of cutting in the testing drill 11 (Comparative Example). In addition, the testing drill 11 was short-lived with the tool life ratio of 76% relative to the tool lives of the conventional drills 1 and 2. Cracks were formed in coating films in the early stage of cutting in the testing drill 12 (Comparative Example). In addition, the testing drill 12 was short-lived with the tool life ratio of 58% relative to the tool lives of the conventional drills 1 and 2.

Contrary to that, in the multilayer hard film-coated cutting tools of the present invention (testing drills 10, 13 to 18), the results showed that they had the tool lives more than 150% relative to the tool lives of the conventional drills 1 and 2.

In the testing drills 19 to 22, the layer thicknesses of the upper layers were different each other. In the testing drill 19, in which the layer thickness was less than 0.075 μm, and the testing drill 22, in which the layer thickness was more than 1.5 μm, each of their tool lives was significantly reduced relative to the conventional drills 1 and 2. In the testing drill 19, TiSiN of the upper layer was too thin; and it did not exhibit the wear resistance effect. In the testing drill 22, the hard TiSiN of the upper layer was too thick; fracturing occurred against the external force during cutting; and the tool life extension effect was not obtained. In the testing drills 20 and 21, which had the upper layers with the appropriate layer thicknesses, each of them showed tool life ratio more than 150% relative to the conventional drills 1 and 2.

In the testing drills 23 and 24, they had the tool life ratios less than 100% relative to the conventional drills 1 and 2 because of the reason described earlier. In the testing drill 23, the layer thickness of the A-layer of the lower layer exceeded the layer thickness of the B-layer. In the testing drill 24, the thickness of the B-layer was more than 2-times of the layer thickness of the A-layer.

In the testing drill 25, in which the Ti concentration of the upper layer was increased to the limit and in the range that the wear resistance effect of TiSiN was unattainable any more, wear during cutting was extremely fast and the testing drill 25 had the tool life less than 50% of the conventional drills 1 and 2.

In the testing drills 26 and 27, the cycle widths of the periodical composition fluctuation of the B-layer, which was the mixed layer of the upper layer, were 12 nm and 250 nm, respectively. When the cycle width was 12 nm, which was lower than 20 nm, the composition fluctuation ratio could not be set to a sufficiently high value. When the cycle width was 250 nm, which was higher than 200 nm, fluctuation of physical characteristics appeared in the interval wider than the appropriate range. Because of these, the testing drills 26 and 27 had the tool life ratios higher than 100% but less than 200% relative to the conventional drills 1 and 2.

In the testing drills 28 to 31, the ratio of the layer thicknesses of the A-layer and the B-layer in the lower layer was kept in the range of 1:1 to 1:2. At the same time, the layer thickness of each of the A-layers was set to 0.15 μm and 1.75 μm; and the layer thickness of each of the B-layers was set to 0.2 μm and 2.7 μm. Similar to the testing drills 23 and 24, they had the tool life ratios more than 50% but less than 200% relative to the conventional drills 1 and 2 because of the reason described earlier.

In the testing drills 32 to 35, the layer thicknesses of the A-layer and the B-layer of the bottom layers were changed. In the testing drills 32 and 33, the layer thickness of each of A-layers was set to 0 μm and 1.5 μm. In the testing drills 34 and 35, the layer thickness of each of B-layers was set to 0 μm and 1.5 μm. Similar to the testing drills 23 and 24, they had poor tool life extending effects in the tool life ratio relative to the conventional drills 1 and 2. Particularly, in the testing drills 32 and 34, in which the layer thicknesses of the A layer and B layer were set to 0 μm, respectively, the testing drills 32 and 34 had the tool life ratios less than 20% relative to the conventional drills 1 and 2.

In the testing drills 36 to 38, the composition fluctuation ratios of Ti in B-layer of the lower layer was set to 98.9%, 2.1%, and 71.5%, respectively. In the testing drill 36, in which the composition fluctuation ratio exceeded 95%, and in the testing drill 37, in which the composition fluctuation ratio was less than 5%, they had the tool life ratios more than 50% but less than 200% relative to the conventional drills 1 and 2 due to excessive fluctuation of physical characteristics because of the excessive composition fluctuation ratio; or due to too little fluctuation of physical characteristics because of the too low composition fluctuation ratio. However, in the testing drill 38 with the appropriate composition fluctuation ratio, it had the tool life ratio of 197% relative to the conventional drills 1 and 2.

Furthermore, according to the cutting tests in the cutting condition B shown in Table 7, in the testing drill 9 which was Comparative Example, wear of the hard film was fast similar to the case in the cutting condition A; and the testing drill 9 had the tool life ratio of 77% relative to the conventional drill 1 and 64% relative to the conventional drill 2 and was short-lived. In the testing drill 11 which was Comparative Example, cracks were formed in the film in the early stage in cutting; and the testing drill 11 had the tool life ratio of 83% relative to the conventional drill 1 and 68% relative to the conventional drill 2 and was short-lived. In the testing drill 12, which was Comparative Example, cracks were formed in the film in the early stage in cutting; and the testing drill 11 had the tool life ratio of 60% relative to the conventional drill 1 and 50% relative to the conventional drill 2 and was short-lived.

Contrary to that, in the multilayer hard film-coated cutting tools of the present invention (testing drills 10, 13 to 18), the results showed that they had the tool lives more than 173% relative to the tool lives of the conventional drill 1 and more than 143% relative to the conventional drill 2.

In testing drills, in which deposition was performed by using an electrode containing V, Mo, Ta, Hf and Si as the Al—Cr alloy electrode, and V, Mo, Ta, Hf, and Si were further included in the B-layer, results similar to the testing drills 16 to 18 were obtained in the cutting tests in the cutting condition A (high-speed cutting) and the cutting condition B (low-speed cutting).

In the testing drills 19 to 22, the layer thicknesses of the upper layer were different each other. In the testing drill 19, in which the layer thickness was less than 0.075 μm, the tool life ratio 1 was 58% relative and the tool life 2 was 48%. In the testing drill 22, in which the layer thickness exceeded 1.5 μm, the tool life ratio 1 was 53% relative and the tool life 2 was 44%. Thus, the testing drills 19 and 22 had the extremely short tool lives relative to the conventional drills. In the testing drill 19, the wear resistance effect was not exhibited due to too thin TiSiN of the upper layer. In the testing drill 22, the tool life extending effect was not obtained due to fracturing against the external force during cutting because the hard TiSiN of the upper layer was too thick. In the testing drills 20 and 21 with the appropriate layer thicknesses of the upper layers, they had the tool lives more than 150% relative to the conventional drills 1 and 2.

In the testing drills 23 and 24, they had the tool life ratios less than 100% relative to the conventional drills 1 and 2 because of the reason described earlier. In the testing drill 23, the layer thickness of the A-layer of the lower layer exceeded the layer thickness of the B-layer. In the testing drill 24, the thickness of the B-layer was more than 2-times of the layer thickness of the A-layer.

In the testing drill 25, in which the Ti concentration of the upper layer was increased to the limit and in the range that the wear resistance effect of TiSiN was unattainable any more, wear during cutting was extremely fast and the testing drill 25 had the tool life less than 50% of the conventional drills 1 and 2.

In the testing drills 26 and 27, the cycle widths of the periodical composition fluctuation of the B-layer, which was the mixed layer of the upper layer, were 12 nm and 250 nm, respectively. When the cycle width was 12 nm, which was lower than 20 nm, the composition fluctuation ratio could not be set to a sufficiently high value. When the cycle width was 250 nm, which was higher than 200 nm, fluctuation of physical characteristics appeared in the interval wider than the appropriate range. Because of these, the testing drills 26 and 27 had the tool life ratios only slightly higher than 100% relative to the conventional drill 2.

In the testing drills 28 to 31, the ratio of the layer thicknesses of the A-layer and the B-layer in the lower layer was kept in the range of 1:1 to 1:2. At the same time, the layer thickness of each of the A-layers was set to 0.15 μm and 1.75 μm; and the layer thickness of each of the B-layers was set to 0.2 μm and 2.7 μm. Similar to the testing drills 23 and 24, they had the tool life ratios only slightly higher than 100% relative to the conventional drill 2 because of the reason described earlier.

In the testing drills 32 to 35, the layer thicknesses of the A-layer and the B-layer of the bottom layers were changed. In the testing drills 32 and 33, the layer thickness of each of A-layers was set to 0 μm and 1.5 μm. In the testing drills 34 and 35, the layer thickness of each of B-layers was set to 0 μm and 1.5 μm. Similar to the testing drills 23 and 24, they had the tool life ratios only slightly higher than 100% relative to the conventional drill 2.

In the testing drills 36 to 38, the composition fluctuation ratios of Ti in B-layer of the lower layer was set to 98.9%, 2.1%, and 71.5%, respectively. In the testing drill 36, in which the composition fluctuation ratio exceeded 95%, and in the testing drill 37, in which the composition fluctuation ratio was less than 5%, they had the tool life ratios only slightly higher than 100% relative to the conventional drills 1 and 2 due to excessive fluctuation of physical characteristics because of the excessive composition fluctuation ratio; or due to too little fluctuation of physical characteristics because of the too low composition fluctuation ratio. However, in the testing drill 38 with the appropriate composition fluctuation ratio, it had the tool life ratio more than 150% relative to the conventional drills 1 and 2.

TABLE 5

| | | Bottom layer | | | | | Lower layer | | | |
|---|---|---|---|---|---|---|---|---|---|---|
| | | $(Al_yCr_{1-y})X$ layer | | Mixed layer of $(Al_yCr_{1-y})X$ and $(Ti_zSi_{1-z})X$ | | | A layer | | B layer | |
| | | | Intended | | | Intended | | Intended | | |
| Type | | Al content amount (y value) | layer thickness (μm) | Al content amount (y value) | Ti content amount (z value) | layer thickness (μm) | Al content amount (y value) | single layer thickness (μm) | Al content amount (y value) | Ti content amount (z value) |
| Testing drills | 9 | 0.1 | 0.1 | 0.1 | 0.85 | 0.1 | 0.1 | 0.35 | 0.1 | 0.85 |
| | 10 | 0.2 | 0.1 | 0.2 | 0.85 | 0.1 | 0.2 | 0.35 | 0.2 | 0.85 |
| | 11 | 0.8 | 0.1 | 0.8 | 0.85 | 0.1 | 0.8 | 0.35 | 0.8 | 0.85 |
| | 12 | 0.7 | 0.1 | 0.7 | 0.6 | 0.1 | 0.7 | 0.35 | 0.7 | 0.6 |
| | 13 | 0.7 | 0.1 | 0.7 | 0.7 | 0.1 | 0.7 | 0.35 | 0.7 | 0.7 |
| | 14 | 0.7 | 0.1 | 0.7 | 0.95 | 0.1 | 0.7 | 0.35 | 0.7 | 0.95 |
| | 15 | 0.7 | 0.1 | 0.7 | 0.85 | 0.1 | 0.7 | 0.35 | 0.7 | 0.85 |
| | 16 | 0.7 | 0.1 | 0.7 | 0.85 | 0.1 | 0.7 | 0.35 | 0.7 | 0.85 |
| | 17 | 0.7 | 0.1 | 0.7 | 0.85 | 0.1 | 0.7 | 0.35 | 0.7 | 0.85 |
| | 18 | 0.7 | 0.1 | 0.7 | 0.85 | 0.1 | 0.7 | 0.35 | 0.7 | 0.85 |
| | 19 | 0.7 | 0.1 | 0.7 | 0.85 | 0.1 | 0.7 | 0.35 | 0.7 | 0.85 |
| | 20 | 0.7 | 0.1 | 0.7 | 0.85 | 0.1 | 0.7 | 0.35 | 0.7 | 0.85 |
| | 21 | 0.7 | 0.1 | 0.7 | 0.85 | 0.1 | 0.7 | 0.35 | 0.7 | 0.85 |
| | 22 | 0.7 | 0.1 | 0.7 | 0.85 | 0.1 | 0.7 | 0.35 | 0.7 | 0.85 |
| | 23 | 0.7 | 0.1 | 0.7 | 0.85 | 0.1 | 0.7 | 0.35 | 0.7 | 0.85 |
| | 24 | 0.7 | 0.1 | 0.7 | 0.85 | 0.1 | 0.7 | 0.35 | 0.7 | 0.85 |
| | 25 | 0.7 | 0.1 | 0.7 | 0.85 | 0.1 | 0.7 | 0.35 | 0.7 | 0.85 |
| | 26 | 0.7 | 0.1 | 0.7 | 0.85 | 0.1 | 0.7 | 0.3 | 0.7 | 0.85 |
| | 27 | 0.7 | 0.1 | 0.7 | 0.85 | 0.1 | 0.7 | 0.6 | 0.7 | 0.85 |
| | 28 | 0.7 | 0.1 | 0.7 | 0.85 | 0.1 | 0.7 | 0.15 | 0.7 | 0.85 |
| | 29 | 0.7 | 0.1 | 0.7 | 0.85 | 0.1 | 0.7 | 1.75 | 0.7 | 0.85 |
| | 30 | 0.7 | 0.1 | 0.7 | 0.85 | 0.1 | 0.7 | 0.2 | 0.7 | 0.85 |
| | 31 | 0.7 | 0.1 | 0.7 | 0.85 | 0.1 | 0.7 | 2.5 | 0.7 | 0.85 |
| | 32 | — | 0 | 0.7 | 0.85 | 0.1 | 0.7 | 0.4 | 0.7 | 0.85 |
| | 33 | 0.7 | 1.5 | 0.7 | 0.85 | 0.1 | 0.7 | 0.4 | 0.7 | 0.85 |
| | 34 | 0.7 | 0.1 | — | — | 0 | 0.7 | 0.4 | 0.7 | 0.85 |
| | 35 | 0.7 | 0.1 | 0.7 | 0.85 | 2.5 | 0.7 | 0.4 | 0.7 | 0.85 |
| | 36 | 0.7 | 0.1 | 0.7 | 0.85 | 0.1 | 0.7 | 0.35 | 0.7 | 0.85 |
| | 37 | 0.7 | 0.1 | 0.7 | 0.85 | 0.1 | 0.7 | 0.35 | 0.7 | 0.85 |
| | 38 | 0.7 | 0.1 | 0.7 | 0.85 | 0.1 | 0.7 | 0.35 | 0.7 | 0.85 |

| | | Lower layer | | | | | |
|---|---|---|---|---|---|---|---|
| | | B layer | | | | | |
| | | Periodical composition fluctuation | | | Intended | | Number of |
| Type | | Cycle width (nm) | C1 [Ti] (atomic %) | C2 [Ti] (atomic %) | Composition fluctuation ratio(%) | single layer thickness (μm) | Ratio between A-layer and B-layer | repeated pairs of A-layer and B-layer |
| Testing drills | 9 | 100 | 31.9 | 5.4 | 83.0 | 0.4 | — | 3 |
| | 10 | 100 | 30.1 | 6.0 | 80.2 | 0.4 | 1:1.1 | 3 |
| | 11 | 100 | 27.9 | 4.3 | 84.7 | 0.4 | 1:1.1 | 3 |
| | 12 | 100 | 23.6 | 3.3 | 86.0 | 0.4 | 1:1.1 | 3 |
| | 13 | 110 | 23.5 | 4.2 | 81.9 | 0.4 | 1:1.1 | 3 |
| | 14 | 110 | 29.2 | 4.1 | 85.9 | 0.4 | 1:1.1 | 3 |
| | 15 | 105 | 31.9 | 5.4 | 83.0 | 0.4 | 1:1.1 | 3 |
| | 16 | 100 | 31.9 | 2.6 | 91.9 | 0.4 | 1:1.1 | 3 |
| | 17 | 100 | 29.2 | 4.1 | 85.9 | 0.4 | 1:1.1 | 3 |
| | 18 | 100 | 30.1 | 6.0 | 80.2 | 0.4 | 1:1.1 | 3 |
| | 19 | 100 | 23.6 | 6.0 | 74.8 | 0.4 | 1:1.1 | 3 |
| | 20 | 100 | 23.5 | 2.6 | 89.1 | 0.4 | 1:1.1 | 3 |
| | 21 | 100 | 29.2 | 4.1 | 85.9 | 0.4 | 1:1.1 | 3 |

TABLE 5-continued

| | | | | | | | |
|---|---|---|---|---|---|---|---|
| 22 | 100 | 31.9 | 7.0 | 78.0 | 0.4 | 1:1.1 | 3 |
| 23 | 100 | 30.1 | 2.6 | 91.5 | 0.3 | 1:0.9 | 3 |
| 24 | 100 | 23.5 | 6.0 | 74.6 | 0.8 | 1:2.3 | 2 |
| 25 | 100 | 30.1 | 8.0 | 73.4 | 0.4 | 1:1.1 | 3 |
| 26 | 12 | 27.9 | 4.3 | 84.7 | 0.35 | 1:1.2 | 5 |
| 27 | 250 | 28.0 | 4.3 | 84.6 | 0.7 | 1:1.2 | 2 |
| 28 | 30 | 28.1 | 4.2 | 85.1 | 0.3 | 1:2.0 | 8 |
| 29 | 100 | 28.1 | 4.1 | 85.4 | 1.9 | 1:1.1 | 2 |
| 30 | 100 | 27.5 | 5.0 | 81.8 | 0.2 | 1:1.0 | 8 |
| 31 | 100 | 27.6 | 5.5 | 80.1 | 2.7 | 1:1.1 | 2 |
| 32 | 100 | 30.0 | 6.2 | 79.3 | 0.4 | 1:1.1 | 3 |
| 33 | 100 | 26.0 | 7.0 | 73.1 | 0.4 | 1:1.1 | 3 |
| 34 | 100 | 25.5 | 3.3 | 87.0 | 0.4 | 1:1.1 | 3 |
| 35 | 100 | 29.2 | 3.3 | 88.7 | 0.4 | 1:1.1 | 3 |
| 36 | 100 | 27.8 | 0.3 | 98.9 | 0.4 | 1:1.1 | 3 |
| 37 | 100 | 28.0 | 27.4 | 2.1 | 0.4 | 1:1.1 | 3 |
| 38 | 100 | 29.8 | 8.5 | 71.5 | 0.4 | 1:1.1 | 3 |

| | Type | | Upper layer $(Ti_zSi_{1-z})X$ layer | | | | |
|---|---|---|---|---|---|---|---|
| | | | Ti content amount (z value) | Intended layer thickness (μm) | W, V, Mo, Nb, Ta, Hf, Zr, and Si component in the layer | Kind of the element X | Remarks |
| Testing drills | 9 | | 0.85 | 0.5 | None | N | C. Ex. |
| | 10 | | 0.85 | 0.5 | None | N | Ex. of the present invention |
| | 11 | | 0.85 | 0.5 | None | N | C. Ex. |
| | 12 | | 0.6 | 0.5 | None | N | C. Ex. |
| | 13 | | 0.7 | 0.5 | None | N | Ex. of the present invention |
| | 14 | | 0.95 | 0.5 | None | N | Ex. of the present invention |
| | 15 | | 0.85 | 0.5 | None | CN | Ex. of the present invention |
| | 16 | | 0.85 | 0.5 | Zr | N | Ex. of the present invention |
| | 17 | | 0.85 | 0.5 | Nb | N | Ex. of the present invention |
| | 18 | | 0.85 | 0.5 | W | N | Ex. of the present invention |
| | 19 | | 0.85 | 0.05 | None | N | C. Ex. |
| | 20 | | 0.85 | 0.1 | None | N | Ex. of the present invention |
| | 21 | | 0.85 | 0.6 | None | N | Ex. of the present invention |
| | 22 | | 0.85 | 1.75 | None | N | C. Ex. |
| | 23 | | 0.85 | 0.5 | None | N | C. Ex. |
| | 24 | | 0.85 | 0.5 | None | N | C. Ex. |
| | 25 | | 1 | 0.5 | None | N | C. Ex. |
| | 26 | | 0.85 | 0.5 | None | N | Ex. of the present invention |
| | 27 | | 0.85 | 0.5 | None | N | Ex. of the present invention |
| | 28 | | 0.85 | 0.5 | None | N | Ex. of the present invention |
| | 29 | | 0.85 | 0.5 | None | N | Ex. of the present invention |
| | 30 | | 0.85 | 0.5 | None | N | Ex. of the present invention |
| | 31 | | 0.85 | 0.5 | None | N | Ex. of the present invention |
| | 32 | | 0.85 | 0.5 | None | N | Ex. of the present invention |
| | 33 | | 0.85 | 0.5 | None | N | Ex. of the present invention |
| | 34 | | 0.85 | 0.5 | None | N | Ex. of the present invention |
| | 35 | | 0.85 | 0.5 | None | N | Ex. of the present invention |
| | 36 | | 0.85 | 0.5 | None | N | Ex. of the present invention |
| | 37 | | 0.85 | 0.5 | None | N | Ex. of the present invention |
| | 38 | | 0.85 | 0.5 | None | N | Ex. of the present invention |

TABLE 6

| | | | Tool live ratio * | | |
|---|---|---|---|---|---|
| Type | Cutting length (m) | Wear state on the cutting edge or the like | Tool life ratio 1 (%) | Tool life ratio 2 (%) | Remarks |
| Testing drill | 9 | 50.5 | Large margin abrasion | 76 | 76 | C. Ex. |
| | 10 | 133.0 | Crack | 200 | 200 | Ex. of the present invention |
| | 11 | 50.5 | Crack | 76 | 76 | C. Ex. |
| | 12 | 38.5 | Crack | 58 | 58 | C. Ex. |
| | 13 | 133.0 | Crack | 200 | 200 | Ex. of the present invention |
| | 14 | 142.5 | Uneven wear | 214 | 214 | Ex. of the present invention |
| | 15 | 142.5 | Uneven wear | 214 | 214 | Ex. of the present invention |
| | 16 | 138.5 | Large abrasion on flank face | 208 | 208 | Ex. of the present invention |

TABLE 6-continued

| Type | Cutting length (m) | Wear state on the cutting edge or the like | Tool life ratio 1 (%) | Tool life ratio 2 (%) | Remarks |
|---|---|---|---|---|---|
| 17 | 138.5 | Large abrasion on flank face | 208 | 208 | Ex. of the present invention |
| 18 | 138.5 | Large abrasion on flank face | 208 | 208 | Ex. of the present invention |
| 19 | 35 | Large abrasion on flank face | 53 | 53 | C. Ex. |
| 20 | 100 | Large abrasion on flank face | 150 | 150 | Ex. of the present invention |
| 21 | 161.5 | Uneven wear | 243 | 243 | Ex. of the present invention |
| 22 | 35 | Crack | 53 | 53 | C. Ex. |
| 23 | 60 | Large abrasion on flank face | 90 | 90 | C. Ex. |
| 24 | 60 | Crack | 90 | 90 | C. Ex. |
| 25 | 32 | Large abrasion on flank face | 48 | 48 | C. Ex. |
| 26 | 98.7 | Uneven wear | 148 | 148 | Ex. of the present invention |
| 27 | 100.6 | Uneven wear | 151 | 151 | Ex. of the present invention |
| 28 | 103.2 | Large margin abrasion | 155 | 155 | Ex. of the present invention |
| 29 | 103.2 | Uneven wear | 155 | 155 | Ex. of the present invention |
| 30 | 100.0 | Uneven wear | 150 | 150 | Ex. of the present invention |
| 31 | 103.2 | Large abrasion on flank face | 155 | 155 | Ex. of the present invention |
| 32 | 82.6 | Uneven wear | 124 | 124 | Ex. of the present invention |
| 33 | 90.3 | Large abrasion on flank face | 136 | 136 | Ex. of the present invention |
| 34 | 80.0 | Uneven wear | 120 | 120 | Ex. of the present invention |
| 35 | 92.2 | Crack | 139 | 139 | Ex. of the present invention |
| 36 | 105.1 | Large abrasion on flank face | 158 | 158 | Ex. of the present invention |
| 37 | 100.6 | Large abrasion on flank face | 151 | 151 | Ex. of the present invention |
| 38 | 130.9 | Large abrasion on flank face | 197 | 197 | Ex. of the present invention |
| Conventional drill 1 | 66.5 | Broken | 100 | 100 | Conventional Example |
| Conventional drill 1 | 66.5 | Broken | 100 | 100 | Conventional Example |

Note:
"Tool life ratio 1" means the ratio of tool life relative to the tool life of the conventional drill 1.
"Tool life ratio 2" means the ratio of tool life relative to the tool life of the conventional drill 2.

TABLE 7

| Type | | Cutting length (m) | Wear state on the cutting edge or the like | Tool life ratio 1 (%) | Tool life ratio 2 (%) | Remarks |
|---|---|---|---|---|---|---|
| Testing drill | 9 | 51.5 | Large margin abrasion | 77 | 64 | C. Ex. |
| | 10 | 115 | Crack | 173 | 143 | Ex. of the present invention |
| | 11 | 55 | Crack | 83 | 68 | C. Ex. |
| | 12 | 40 | Crack | 60 | 50 | C. Ex. |
| | 13 | 120 | Crack | 180 | 149 | Ex. of the present invention |
| | 14 | 150.5 | Uneven wear | 226 | 187 | Ex. of the present invention |
| | 15 | 142.5 | Uneven wear | 214 | 177 | Ex. of the present invention |
| | 16 | 124 | Large abrasion on flank face | 186 | 154 | Ex. of the present invention |
| | 17 | 131.5 | Large abrasion on flank face | 198 | 164 | Ex. of the present invention |
| | 18 | 131.5 | Large abrasion on flank face | 198 | 164 | Ex. of the present invention |
| | 19 | 38.5 | Large abrasion on flank face | 58 | 48 | C. Ex. |
| | 20 | 121 | Large abrasion on flank face | 182 | 150 | Ex. of the present invention |
| | 21 | 161.5 | Large abrasion on flank face | 243 | 201 | Ex. of the present invention |
| | 22 | 35 | Crack | 53 | 44 | C. Ex. |
| | 23 | 65 | Large abrasion on flank face | 98 | 81 | C. Ex. |
| | 24 | 60 | Uneven wear | 90 | 75 | C. Ex. |
| | 25 | 30 | Crack | 45 | 37 | C. Ex. |
| | 26 | 91 | Uneven wear | 137 | 113 | Ex. of the present invention |
| | 27 | 83.5 | Uneven wear | 126 | 104 | Ex. of the present invention |
| | 28 | 81.5 | Large margin abrasion | 123 | 101 | Ex. of the present invention |
| | 29 | 83.5 | Uneven wear | 126 | 104 | Ex. of the present invention |
| | 30 | 87.5 | Uneven wear | 132 | 109 | Ex. of the present invention |
| | 31 | 85 | Large abrasion on flank face | 128 | 106 | Ex. of the present invention |
| | 32 | 81.8 | Uneven wear | 123 | 102 | Ex. of the present invention |
| | 33 | 87.5 | Large abrasion on flank face | 132 | 109 | Ex. of the present invention |
| | 34 | 81.8 | Uneven wear | 123 | 102 | Ex. of the present invention |
| | 35 | 85 | Uneven wear | 128 | 106 | Ex. of the present invention |
| | 36 | 81.5 | Large abrasion on flank face | 123 | 101 | Ex. of the present invention |

TABLE 7-continued

| | | | Tool life ratio * | | |
|---|---|---|---|---|---|
| Type | Cutting length (m) | Wear state on the cutting edge or the like | Tool life ratio 1 (%) | Tool life ratio 2 (%) | Remarks |
| 37 | 85 | Large abrasion on flank face | 128 | 106 | Ex. of the present invention |
| 38 | 121.5 | Large abrasion on flank face | 183 | 151 | Ex. of the present invention |
| Conventional drill 1 | 66.5 | Broken | 100 | 83 | Conventional Example |
| Conventional drill 2 | 80.4 | Broken | 121 | 100 | Conventional Example |

Note:
"Tool life ratio 1" means the ratio of tool life relative to the tool life of the conventional drill 1.
"Tool life ratio 2" means the ratio of tool life relative to the tool life of the conventional drill 2.

Based on the results in Example 1 shown in Tables 3 and 4 and the results in Example 2 shown in Tables 6 and 7, it was demonstrated that the multilayer hard film-coated cutting tools of the present invention had broad utility in any one of the high-speed cutting and the normal (low-speed) cutting because of: the upper layer being constituted by the layer of the composition containing at least Ti and Si with the predetermined composition and the predetermined layer thickness; the lower layer being constituted by the multilayer film made of 2 to 8 repeated pairs of the A-layer and the B-layer; the A-layer being constituted by the layer of the composition containing at least Al and Cr; and the B-layer being constituted by the mixed layer of the layer of the composition containing at least Ti and Si and the A-layer. Furthermore, the multilayer hard film-coated cutting tools of the present invention exhibited excellent cutting performance for a long time without anomalous damages such as chipping, fracturing, or the like relative to the conventional drills 1 and 2.

INDUSTRIAL APPLICABILITY

The multilayer hard film-coated cutting tool of the present invention has broad utility and excellent cutting characteristics. Thus, the metal materials, such as carbon steel, alloy steel, and the like, frequently used in the auto industry or the like can be cut with the multilayer hard film-coated cutting tool of the present invention with the high efficiency and the long tool life.

The invention claimed is:

1. A multilayer hard film-coated cutting tool comprising:
a cutting tool body; and
a multilayer hard film formed on a surface of the cutting tool body, wherein
(a) the multilayer hard film comprises at least an upper layer provided as an outermost layer, and a lower layer provided between the upper layer and the cutting tool body;
(b) the upper layer is made of a Ti and Si compound layer, which includes X, and has a layer thickness of 0.075 µm to 1.5 µm, $0.7 \leq z \leq 0.99$ (z in atomic ratio) being satisfied in a case where the chemical composition of the Ti and Si compound layer is expressed by a composition formula of $(Ti_zSi_{1-z})X$ and X being any one of N, C, B, CN, BN, CBN, NO, CO, BO, CNO, BNO, and CBNO;
(c) the lower layer is made of a multi-layered film formed of pairs of layers, each pair comprising a single A-layer and a single B-layer, wherein the layer thickness of the B-layer is equal to or thicker than the layer thickness of the A-layer, a ratio of the layer thicknesses of the A-layer and the B-layer being A-layer:B-layer=1:1 to 1:2, the multilayered-film having 2 to 8 pairs of the A-layer and the B-layer;
(d) the A-layer is a layer made of a compound including at least Al and Cr, $0.2 \leq y \leq 0.7$ (y in atomic ratio) being satisfied in a case where the compound including at least Al and Cr is expressed by a composition formula of $(Al_yCr_{1-y})X$ and X being any one of N, C, B, CN, BN, CBN, NO, CO, BO, CNO, BNO, and CBNO; and
(e) the B-layer is a mixed layer of $(Ti_zSi_{1-z})X$ and $(Al_yCr_{1-y})X$, X being any one of N, C, B, CN, BN, CBN, NO, CO, BO, CNO, BNO, and CBNO.

2. The multilayer hard film-coated cutting tool according to claim 1, wherein the mixed layer is formed of $(Ti_zSi_{1-z})X$ layers and $(Al_yCr_{1-y})X$ layers, and each individual $(Ti_zSi_{1-z})X$ layer and each individual $(Al_yCr_{1-y})X$ layer is deposited alternate one on each other, and each individual $(Ti_zSi_{1-z})X$ layer and each individual $(Al_yCr_{1-y})X$ layer comprised in the mixed layer has preferably an individual layer thickness not thicker than 100 nm.

3. The multilayer hard film-coated cutting tool according to claim 1, wherein the upper layer has a layer thickness of 0.2 µm to 1.5 µm.

4. The multilayer hard film-coated cutting tool according to claim 1, wherein the upper layer has a layer thickness of 0.6 µm to 1.5 µm.

5. The multilayer hard film-coated cutting tool according to claim 1, wherein the A-layer has a layer thickness of 0.25 µm to 1.5 µm.

6. The multilayer hard film-coated cutting tool according to claim 1, wherein the B-layer has a layer thickness of 0.25 µm to 2.5 µm.

7. The multilayer hard film-coated cutting tool according to claim 1, wherein at least one layer of the A-layers and at least one layer of the B-layers comprised in the multilayered film further include at least any one of components elements selected from W, V, Mo, Nb, Ta, Hf, and Zr; or Si.

8. The multilayer hard film-coated cutting tool according to claim 1, wherein
a width of a periodical composition fluctuation of the B-layer is 20 nm to 200 nm, the width of the periodical composition fluctuation (nm) being obtained as a thickness between a location having a local maximum content of a Ti component and an adjacent location having a local maximum content of the Ti component obtained by measurement of TEM-EDS; and
a composition variation rate of the periodical composition fluctuation is 5% to 95%, the composition variation rate being obtained as a ratio (%) in which a difference of the local maximum content and a local minimum content is divided by the local maximum content between the location having the local maximum content of the Ti component and the adjacent location having the local maximum content of the Ti component obtained by measurement of TEM-EDS.

9. The multilayer hard film-coated cutting tool according to claim 1, wherein
a bottom layer is formed between the cutting tool body and the lower layer; and the bottom layer is made of the A-layer having a layer thickness of 0.05 μm to 1.5 μm and the B-layer having a layer thickness of 0.05 μm to 2.5 μm.

* * * * *